(12) United States Patent
Langhammer

(10) Patent No.: US 8,886,696 B1
(45) Date of Patent: Nov. 11, 2014

(54) DIGITAL SIGNAL PROCESSING CIRCUITRY WITH REDUNDANCY AND ABILITY TO SUPPORT LARGER MULTIPLIERS

(75) Inventor: Martin Langhammer, Alderbury (GB)

(73) Assignee: Altera Corporation, San Jose, CA (US)

( * ) Notice: Subject to any disclaimer, the term of this patent is extended or adjusted under 35 U.S.C. 154(b) by 1132 days.

(21) Appl. No.: 12/380,853

(22) Filed: Mar. 3, 2009

(51) Int. Cl.
- *G06F 7/52* (2006.01)
- *H03K 19/173* (2006.01)
- *H03K 19/177* (2006.01)
- *H01L 25/00* (2006.01)

(52) U.S. Cl.
USPC .............. 708/620; 708/625; 326/38; 326/41; 326/47

(58) Field of Classification Search
USPC ................... 326/37–47; 708/490, 523, 603, 708/620–625
See application file for complete search history.

(56) References Cited

U.S. PATENT DOCUMENTS

| | | | |
|---|---|---|---|
| 3,473,160 A | 10/1969 | Wahlstrom |
| 4,156,927 A | 5/1979 | McElroy et al. |
| 4,179,746 A | 12/1979 | Tubbs |
| 4,212,076 A | 7/1980 | Conners |
| 4,215,406 A | 7/1980 | Gomola et al. |
| 4,215,407 A | 7/1980 | Gomola et al. |
| 4,422,155 A | 12/1983 | Amir et al. |
| 4,484,259 A | 11/1984 | Palmer et al. |
| 4,521,907 A | 6/1985 | Amir et al. |
| 4,597,053 A | 6/1986 | Chamberlin |
| 4,623,961 A | 11/1986 | Mackiewicz |
| 4,682,302 A | 7/1987 | Williams |
| 4,718,057 A | 1/1988 | Venkitakrishnan et al. |
| 4,727,508 A | 2/1988 | Williams |
| 4,791,590 A | 12/1988 | Ku et al. |
| 4,799,004 A | 1/1989 | Mori |
| 4,823,295 A | 4/1989 | Mader |
| 4,839,847 A | 6/1989 | Laprade |
| 4,871,930 A | 10/1989 | Wong et al. |
| 4,912,345 A | 3/1990 | Steele et al. |
| 4,967,160 A | 10/1990 | Quievy et al. |
| 4,982,354 A | 1/1991 | Takeuchi et al. |
| 4,994,997 A | 2/1991 | Martin et al. |
| 5,122,685 A | 6/1992 | Chan et al. |
| 5,128,559 A | 7/1992 | Steele |

(Continued)

FOREIGN PATENT DOCUMENTS

| | | |
|---|---|---|
| EP | 0 158 430 | 10/1985 |
| EP | 0 380 456 | 8/1990 |

(Continued)

OTHER PUBLICATIONS

Amos, D., "PLD architectures match DSP algorithms," *Electronic Product Design*, vol. 17, No. 7, Jul. 1996, pp. 30, 32.

(Continued)

*Primary Examiner* — Chuong D Ngo
*Assistant Examiner* — Matthew Sandifer
(74) *Attorney, Agent, or Firm* — Ropes & Gray LLP; Jeffrey H. Ingerman

(57) ABSTRACT

Digital signal processing ("DSP") circuit blocks that include multipliers of a certain basic size are augmented to enable the DSP block to perform multiplications that are larger than the basic multiplier size would otherwise permit. In some embodiments, the larger multiplication can have less than full precision. In other embodiments, the larger multiplication can have full precision by making use of some capabilities of a second DSP block.

21 Claims, 14 Drawing Sheets

(56) References Cited

U.S. PATENT DOCUMENTS

| | | | |
|---|---|---|---|
| 5,175,702 A | 12/1992 | Beraud et al. |
| 5,208,491 A | 5/1993 | Ebeling et al. |
| RE34,363 E | 8/1993 | Freeman |
| 5,267,187 A | 11/1993 | Hsieh et al. |
| 5,296,759 A | 3/1994 | Sutherland et al. |
| 5,338,983 A | 8/1994 | Agarwala |
| 5,349,250 A | 9/1994 | New |
| 5,357,152 A | 10/1994 | Jennings, III et al. |
| 5,371,422 A | 12/1994 | Patel et al. |
| 5,381,357 A | 1/1995 | Wedgwood et al. |
| 5,404,324 A | 4/1995 | Colon-Bonet |
| 5,424,589 A | 6/1995 | Dobbelaere et al. |
| 5,446,651 A | 8/1995 | Moyse et al. |
| 5,451,948 A | 9/1995 | Jekel |
| 5,452,231 A | 9/1995 | Butts et al. |
| 5,452,375 A | 9/1995 | Rousseau et al. |
| 5,457,644 A | 10/1995 | McCollum |
| 5,465,226 A | 11/1995 | Goto |
| 5,465,375 A | 11/1995 | Thepaut et al. |
| 5,483,178 A | 1/1996 | Costello et al. |
| 5,497,498 A | 3/1996 | Taylor |
| 5,500,828 A | 3/1996 | Doddington et al. |
| 5,523,963 A | 6/1996 | Hsieh et al. |
| 5,528,550 A | 6/1996 | Pawate et al. |
| 5,537,601 A | 7/1996 | Kimura et al. |
| 5,546,018 A | 8/1996 | New et al. |
| 5,550,993 A | 8/1996 | Ehlig et al. |
| 5,559,450 A | 9/1996 | Ngai et al. |
| 5,563,526 A | 10/1996 | Hastings et al. |
| 5,563,819 A | 10/1996 | Nelson |
| 5,570,039 A | 10/1996 | Oswald et al. |
| 5,570,040 A | 10/1996 | Lytle et al. |
| 5,572,148 A | 11/1996 | Lytle et al. |
| 5,581,501 A | 12/1996 | Sansbury et al. |
| 5,590,350 A | 12/1996 | Guttag et al. |
| 5,594,366 A | 1/1997 | Khong et al. |
| 5,594,912 A | 1/1997 | Brueckmann et al. |
| 5,596,763 A | 1/1997 | Guttag et al. |
| 5,606,266 A | 2/1997 | Pedersen |
| 5,617,058 A | 4/1997 | Adrian et al. |
| 5,633,601 A | 5/1997 | Nagaraj |
| 5,636,150 A | 6/1997 | Okamoto |
| 5,636,368 A | 6/1997 | Harrison et al. |
| 5,640,578 A | 6/1997 | Balmer et al. |
| 5,644,522 A | 7/1997 | Moyse et al. |
| 5,646,545 A | 7/1997 | Trimberger et al. |
| 5,648,732 A | 7/1997 | Duncan |
| 5,652,903 A | 7/1997 | Weng et al. |
| 5,655,069 A | 8/1997 | Ogawara et al. |
| 5,664,192 A | 9/1997 | Lloyd et al. |
| 5,689,195 A | 11/1997 | Cliff et al. |
| 5,696,708 A | 12/1997 | Leung |
| 5,729,495 A | 3/1998 | Madurawe |
| 5,740,404 A | 4/1998 | Baji |
| 5,744,980 A | 4/1998 | McGowan et al. |
| 5,744,991 A | 4/1998 | Jefferson et al. |
| 5,754,459 A | 5/1998 | Telikepalli |
| 5,761,483 A | 6/1998 | Trimberger |
| 5,764,555 A | 6/1998 | McPherson et al. |
| 5,768,613 A | 6/1998 | Asghar |
| 5,777,912 A | 7/1998 | Leung et al. |
| 5,784,636 A | 7/1998 | Rupp |
| 5,790,446 A | 8/1998 | Yu et al. |
| 5,794,067 A | 8/1998 | Kadowaki |
| 5,801,546 A | 9/1998 | Pierce et al. |
| 5,805,477 A | 9/1998 | Perner |
| 5,805,913 A | 9/1998 | Guttag et al. |
| 5,812,479 A | 9/1998 | Cliff et al. |
| 5,812,562 A | 9/1998 | Baeg |
| 5,815,422 A | 9/1998 | Dockser |
| 5,821,776 A | 10/1998 | McGowan |
| 5,825,202 A | 10/1998 | Tavana et al. |
| 5,838,165 A | 11/1998 | Chatter |
| 5,841,684 A | 11/1998 | Dockser |
| 5,847,579 A | 12/1998 | Trimberger |
| 5,859,878 A | 1/1999 | Phillips et al. |
| 5,869,979 A | 2/1999 | Bocchino |
| 5,872,380 A | 2/1999 | Rostoker et al. |
| 5,874,834 A | 2/1999 | New |
| 5,878,250 A | 3/1999 | LeBlanc |
| 5,880,981 A | 3/1999 | Kojima et al. |
| 5,892,962 A | 4/1999 | Cloutier |
| 5,894,228 A | 4/1999 | Reddy et al. |
| 5,898,602 A | 4/1999 | Rothman et al. |
| 5,931,898 A | 8/1999 | Khoury |
| 5,942,914 A | 8/1999 | Reddy et al. |
| 5,944,774 A | 8/1999 | Dent |
| 5,949,710 A | 9/1999 | Pass et al. |
| 5,951,673 A | 9/1999 | Miyata |
| 5,956,265 A | 9/1999 | Lewis |
| 5,959,871 A | 9/1999 | Pierzchala et al. |
| 5,960,193 A | 9/1999 | Guttag et al. |
| 5,961,635 A | 10/1999 | Guttag et al. |
| 5,963,048 A | 10/1999 | Harrison et al. |
| 5,963,050 A | 10/1999 | Young et al. |
| 5,968,196 A | 10/1999 | Ramamurthy et al. |
| 5,970,254 A | 10/1999 | Cooke et al. |
| 5,978,260 A | 11/1999 | Trimberger et al. |
| 5,982,195 A | 11/1999 | Cliff et al. |
| 5,986,465 A | 11/1999 | Mendel |
| 5,991,788 A | 11/1999 | Mintzer |
| 5,991,898 A | 11/1999 | Rajski et al. |
| 5,995,748 A | 11/1999 | Guttag et al. |
| 5,999,015 A | 12/1999 | Cliff et al. |
| 5,999,990 A | 12/1999 | Sharrit et al. |
| 6,005,806 A | 12/1999 | Madurawe et al. |
| 6,006,321 A | 12/1999 | Abbott |
| 6,009,451 A | 12/1999 | Burns |
| 6,020,759 A | 2/2000 | Heile |
| 6,021,423 A | 2/2000 | Nag et al. |
| 6,029,187 A | 2/2000 | Verbauwhede |
| 6,031,763 A | 2/2000 | Sansbury |
| 6,041,340 A | 3/2000 | Mintzer |
| 6,052,327 A | 4/2000 | Reddy et al. |
| 6,052,755 A | 4/2000 | Terrill et al. |
| 6,064,614 A | 5/2000 | Khoury |
| 6,065,131 A | 5/2000 | Andrews et al. |
| 6,066,960 A | 5/2000 | Pedersen |
| 6,069,487 A | 5/2000 | Lane et al. |
| 6,072,994 A | 6/2000 | Phillips et al. |
| 6,073,154 A | 6/2000 | Dick |
| 6,075,381 A | 6/2000 | LaBerge |
| 6,084,429 A | 7/2000 | Trimberger |
| 6,085,317 A | 7/2000 | Smith |
| 6,091,261 A | 7/2000 | DeLange |
| 6,091,765 A | 7/2000 | Pietzold, III et al. |
| 6,094,726 A | 7/2000 | Gonion et al. |
| 6,097,988 A | 8/2000 | Tobias |
| 6,098,163 A | 8/2000 | Guttag et al. |
| 6,107,820 A | 8/2000 | Jefferson et al. |
| 6,107,821 A | 8/2000 | Kelem et al. |
| 6,107,824 A | 8/2000 | Reddy et al. |
| 6,130,554 A | 10/2000 | Kolze et al. |
| 6,140,839 A | 10/2000 | Kaviani et al. |
| 6,154,049 A | 11/2000 | New |
| 6,157,210 A | 12/2000 | Zaveri et al. |
| 6,163,788 A | 12/2000 | Chen et al. |
| 6,167,415 A | 12/2000 | Fischer et al. |
| 6,175,849 B1 | 1/2001 | Smith |
| 6,215,326 B1 | 4/2001 | Jefferson et al. |
| 6,226,735 B1 | 5/2001 | Mirsky |
| 6,242,947 B1 | 6/2001 | Trimberger |
| 6,243,729 B1 | 6/2001 | Staszewski |
| 6,246,258 B1 | 6/2001 | Lesea |
| 6,279,021 B1 | 8/2001 | Takano et al. |
| 6,286,024 B1 | 9/2001 | Yano et al. |
| 6,298,366 B1 * | 10/2001 | Gatherer et al. ............... 708/523 |
| 6,314,442 B1 | 11/2001 | Suzuki |
| 6,314,551 B1 | 11/2001 | Borland |
| 6,321,246 B1 | 11/2001 | Page et al. |
| 6,323,680 B1 | 11/2001 | Pedersen et al. |
| 6,351,142 B1 | 2/2002 | Abbott |
| 6,359,468 B1 | 3/2002 | Park et al. |
| 6,362,650 B1 | 3/2002 | New et al. |

(56) References Cited

U.S. PATENT DOCUMENTS

| | | |
|---|---|---|
| 6,366,944 B1 | 4/2002 | Hossain et al. |
| 6,367,003 B1 | 4/2002 | Davis |
| 6,407,576 B1 | 6/2002 | Ngai et al. |
| 6,407,694 B1 | 6/2002 | Cox et al. |
| 6,438,570 B1 | 8/2002 | Miller |
| 6,453,382 B1 | 9/2002 | Heile |
| 6,467,017 B1 | 10/2002 | Ngai et al. |
| 6,480,980 B2 | 11/2002 | Koe |
| 6,483,343 B1 | 11/2002 | Faith et al. |
| 6,531,888 B2 | 3/2003 | Abbott |
| 6,538,470 B1 | 3/2003 | Langhammer et al. |
| 6,542,000 B1 | 4/2003 | Black et al. |
| 6,556,044 B2 | 4/2003 | Langhammer et al. |
| 6,557,092 B1 | 4/2003 | Callen |
| 6,571,268 B1 | 5/2003 | Giacalone et al. |
| 6,573,749 B2 | 6/2003 | New et al. |
| 6,574,762 B1 | 6/2003 | Karimi et al. |
| 6,591,283 B1 | 7/2003 | Conway et al. |
| 6,591,357 B2 | 7/2003 | Mirsky |
| 6,600,788 B1 | 7/2003 | Dick et al. |
| 6,628,140 B2 | 9/2003 | Langhammer et al. |
| 6,700,581 B2 | 3/2004 | Baldwin et al. |
| 6,725,441 B1 | 4/2004 | Keller et al. |
| 6,728,901 B1 | 4/2004 | Rajski et al. |
| 6,731,133 B1 | 5/2004 | Feng et al. |
| 6,744,278 B1 | 6/2004 | Liu et al. |
| 6,745,254 B2 | 6/2004 | Boggs et al. |
| 6,774,669 B1 | 8/2004 | Liu et al. |
| 6,781,408 B1 * | 8/2004 | Langhammer ............ 326/41 |
| 6,781,410 B2 | 8/2004 | Pani et al. |
| 6,788,104 B2 | 9/2004 | Singh et al. |
| 6,836,839 B2 | 12/2004 | Master et al. |
| 6,874,079 B2 * | 3/2005 | Hogenauer ............ 712/201 |
| 6,904,471 B2 | 6/2005 | Boggs et al. |
| 6,924,663 B2 | 8/2005 | Masui et al. |
| 6,971,083 B1 | 11/2005 | Farrugia et al. |
| 7,230,451 B1 * | 6/2007 | Langhammer ............ 326/41 |
| 7,269,617 B1 * | 9/2007 | Esposito et al. ............ 708/625 |
| 7,287,051 B1 * | 10/2007 | Langhammer ............ 708/490 |
| 7,346,644 B1 * | 3/2008 | Langhammer et al. ....... 708/625 |
| 7,698,358 B1 * | 4/2010 | Langhammer et al. ....... 708/523 |
| 7,746,112 B1 * | 6/2010 | Gaide et al. ............ 326/41 |
| 7,836,117 B1 * | 11/2010 | Langhammer et al. ....... 708/603 |
| 2001/0029515 A1 | 10/2001 | Mirsky |
| 2002/0089348 A1 | 7/2002 | Langhammer |
| 2003/0088757 A1 | 5/2003 | Lindner et al. |
| 2004/0064770 A1 | 4/2004 | Xin |
| 2004/0083412 A1 | 4/2004 | Corbin et al. |
| 2004/0178818 A1 | 9/2004 | Crotty et al. |
| 2004/0193981 A1 | 9/2004 | Clark et al. |
| 2005/0144215 A1 * | 6/2005 | Simkins et al. ............ 708/620 |
| 2005/0166038 A1 | 7/2005 | Wang et al. |
| 2005/0187999 A1 | 8/2005 | Zheng et al. |
| 2007/0185951 A1 * | 8/2007 | Lee et al. ............ 708/493 |
| 2007/0185952 A1 | 8/2007 | Langhammer et al. |
| 2008/0133627 A1 | 6/2008 | Langhammer et al. |

FOREIGN PATENT DOCUMENTS

| | | |
|---|---|---|
| EP | 0 411 491 | 2/1991 |
| EP | 0 461 798 | 12/1991 |
| EP | 0 498 066 | 8/1992 |
| EP | 0 555 092 | 8/1993 |
| EP | 0 606 653 | 7/1994 |
| EP | 0 657 803 | 6/1995 |
| EP | 0 660 227 | 6/1995 |
| EP | 0 668 659 | 8/1995 |
| EP | 0 905 906 | 3/1999 |
| EP | 0 909 028 | 4/1999 |
| EP | 0 927 393 | 7/1999 |
| EP | 0 992 885 | 4/2000 |
| EP | 1 031 934 | 8/2000 |
| EP | 1 058 185 | 12/2000 |
| EP | 1 220 108 | 7/2002 |
| GB | 2 283 602 | 5/1995 |
| GB | 2 286 737 | 8/1995 |
| GB | 2 318 198 | 4/1998 |
| JP | 61-237133 | 10/1986 |
| JP | 7-135447 | 5/1995 |
| WO | WO95/27243 | 10/1995 |
| WO | WO96/28774 | 9/1996 |
| WO | WO97/08606 | 3/1997 |
| WO | WO98/12629 | 3/1998 |
| WO | WO98/32071 | 7/1998 |
| WO | WO98/38741 | 9/1998 |
| WO | WO99/22292 | 5/1999 |
| WO | WO99/31574 | 6/1999 |
| WO | WO99/56394 | 11/1999 |
| WO | WO00/51239 | 8/2000 |
| WO | WO00/52824 | 9/2000 |
| WO | WO01/13562 | 2/2001 |
| WO | WO2005/101190 | 10/2005 |

OTHER PUBLICATIONS

Analog Devices, Inc., The Applications Engineering Staff of Analog Devices, DSP Division, *Digital Signal Processing Applications Using the ADSP-2100 Family* (edited by Amy Mar), 1990, pp. 141-192).

Andrejas, J., et al., "Reusable DSP functions in FPGAs," *Field-Programmable Logic and Applications, Roadmap to Reconfigurable Computing, 10th International Conference, FPL 2000. Proceedings* (*Lecture Notes in Computer Science* vol. 1896), Aug. 27-30, 2000, pp. 456-461.

Aoki, T., "Signed-weight arithmetic and its application to a field-programmable digital filter architecture," *IEICE Transactions on Electronics* , 1999 , vol. E82C, No. 9, Sep. 1999, pp. 1687-1698.

Ashour, M.A., et al., "An FPGA implementation guide for some different types of serial-parallel multiplier-structures," *Microelectronics Journal*, vol. 31, No. 3, 2000, pp. 161-168.

Berg. B.L., et al."Designing Power and Area Efficient Multistage FIR Decimators with Economical Low Order Filters," *ChipCenter Technical Note*, Dec. 2001.

Bursky, D., "Programmable Logic Challenges Traditional ASIC SoC Designs", *Electronic Design*, Apr. 15, 2002.

Chhabra, A. et al., Texas Instruments Inc., "A Block Floating Point Implementation on the TMS320C54x DSP", Application Report SPRA610, Dec. 1999, pp. 1-10.

Colet, p., "When DSPs and FPGAs meet: Optimizing image processing architectures," *Advanced Imaging*, vol. 12, No. 9, Sep. 1997, pp. 14, 16, 18.

Crookes, D., et al., "Design and implementation of a high level programming environment for FPGA-based image processing," *IEE Proceedings—Vision, Image and Signal Processing*, vol. 147, No. 4, Aug. 2000, pp. 377-384.

Debowski, L., et al., "A new flexible architecture of digital control systems based on DSP and complex CPLD technology for power conversion applications," *PCIM 2000: Europe Official Proceedings of the Thirty-Seventh International Intelligent Motion Conference*, Jun. 6-8, 2000, pp. 281-286.

Dick, C., et al., "Configurable logic for digital communications: some signal processing perspectives," *IEEE Communications Magazine*, vol. 37, No. 8, Aug. 1999, pp. 107-111.

Do, T.-T., et al., "A flexible implementation of high-performance FIR filters on Xilinx FPGAs," *Field-Programmable Logic and Applications: From FPGAs to Computing Paradigm. 8th International Workshop, FPL'98. Proceedings*, Hartenstein, R.W., et al., eds., Aug. 31-Sep. 3, 1998, pp. 441-445.

Gaffar, A.A., et al., "Floating-Point Bitwidth Analysis via Automatic Differentiation," *IEEE Conference on Field Programmable Technology*, Hong Kong, Dec. 2002.

Guccione, S.A.,"Run-time Reconfiguration at Xilinx " *Parallel and distributed processing: 15 IPDPS 2000 workshops*, Rolim, J., ed., May 1-5, 2000, p. 873.

Hauck, S., "The Future of Reconfigurable Systems," *Keynote Address, 5th Canadian Conference on Field Programmable Devices*, Jun. 1998, http://www.ee.washington.edu/people/faculty/hauck/publications/ReconfigFuture.PDF.

(56) References Cited

OTHER PUBLICATIONS

Heysters, P.M., et al., "Mapping of DSP algorithms on field programmable function arrays," *Field-Programmable Logic and Applications, Roadmap to Reconfigurable Computing. 10th International Conference, FPL 2000. Proceedings* (*Lecture Notes in Computer Science* vol. 1896), Aug. 27-30, 2000, pp. 400-411.

Huang, J., et al., "Simulated Performance of 1000BASE-T Receiver with Different Analog Front End Designs," *Proceedings of the 35th Asilomar Conference on Signals, Systems, and Computers*, Nov. 4-7, 2001.

Lattice Semiconductor Corp, *ORCA® FPGA Express™ Interface Manual: ispLEVER® Version 3.0*, 2002.

Lucent Technologies, Microelectronics Group, "Implementing and Optimizing Multipliers in ORCA™ FPGAs,", Application Note. AP97-008FGPA, Feb. 1997.

"Implementing Multipliers in FLEX 10K EABs", *Altera*, Mar. 1996.

"Implementing Logic with the Embedded Array in FLEX 10K Devices", *Altera*, May 2001, ver. 2.1.

Jinghua Li, "Design a pocket multi-bit multiplier in FPGA," *1996 2nd International Conference on ASIC Proceedings* (*IEEE* Cat. No. 96TH8140), Oct. 21-24, 1996, pp. 275-279.

Jones, G., "Field-programmable digital signal conditioning," *Electronic Product Design*, vol. 21, No. 6, Jun. 2000, pp. C36-C38.

Kiefer, R., et al., "Performance comparison of software/FPGA hardware partitions for a DSP application," *14th Australian Microelectronics Conference. Microelectronics: Technology Today for the Future, MICRO '97 Proceedings*, Sep. 28-Oct. 1, 1997, pp. 88-93.

Kramberger, I., "DSP acceleration using a reconfigurable FPGA," *ISIE '99, Proceedings of the IEEE International Symposium on Industrial Electronics* (Cat. No. 99TH8465) vol. 3 , Jul. 12-16, 1999, pp. 1522-1525.

Langhammer, M., "How to implement DSP in programmable logic," *Elettronica Oggi*, No. 266 , Dec. 1998, pp. 113-115.

Langhammer, M., "Implementing a DSP in Programmable Logic," *Online EE Times*, May 1998, http://www.eetimes.com/editorial/1998/coverstory9805.html.

Lazaravich, B.V., "Function block oriented field programmable logic arrays," *Motorola, Inc. Technical Developments*, vol. 18, Mar. 1993, pp. 10-11.

Lund, D., et al., "A new development system for reconfigurable digital signal processing," *First International Conference on 3G Mobile Communication Technologies* (Conf. Publ. No. 471), Mar. 27-29, 2000, pp. 306-310.

Miller, N.L., et al., "Reconfigurable integrated circuit for high performance computer arithmetic," *Proceedings of the 1998 IEE Colloquium on Evolvable Hardware Systems* (*Digest*), No. 233, 1998, pp. 2/1-2/4.

Mintzer, L., "Xilinx FPGA as an FFT processor," *Electronic Engineering*, vol. 69, No. 845, May 1997, pp. 81, 82, 84.

Faura et al., "A Novel Mixed Signal Programmable Device With On-Chip Microprocessor," Custom Integrated Circuits Conference, 1997. Proceedings of the IEEE 1997 Santa Clara, CA, USA, May 5, 1997, pp. 103-106.

Nozal, L., et al., "A new vision system: programmable logic devices and digital signal processor architecture (PLD+DSP)," *Proceedings IECON '91. 1991 International Conference on Industrial Electronics, Control and Instrumentation* (Cat. No. 91CH2976-9), vol. 3, Oct. 28-Nov. 1, 1991, pp. 2014-2018.

Papenfuss, J.R, et al., "Implementation of a real-time, frequency selective, RF channel simulator using a hybrid DSP-FPGA architecture," *RAWCON 2000: 2000 IEEE Radio and Wireless Conference* (Cat. No. 00EX404), Sep. 10-13, 2000, pp. 135-138.

Parhami, B., "Configurable arithmetic arrays with data-driven control," *34th Asilomar Conference on Signals, Systems and Computers*, vol. 1, 2000, pp. 89-93.

"The QuickDSP Design Guide", Quicklogic, Aug. 2001, revision B.

"QuickDSP™ Family Data Sheet", *Quicklogic*, Aug. 7, 2001, revision B.

Rangasayee, K., "Complex PLDs let you produce efficient arithmetic designs," *EDN (European Edition)*, vol. 41, No. 13, Jun. 20, 1996, pp. 109, 110, 112, 114, 116.

Rosado, A., et al., "A high-speed multiplier coprocessor unit based on FPGA," *Journal of Electrical Engineering*, vol. 48, No. 11-12, 1997, pp. 298-302.

Santillan-Q., G.F., et al., "Real-time integer convolution implemented using systolic arrays and a digit-serial architecture in complex programmable logic devices," *Proceedings of the Third International Workshop on Design of Mixed-Mode Integrated Circuits and Applications* (Cat. No. 99EX303), Jul. 26-28, 1999, pp. 147-150.

Texas Instruments Inc., "TMS320C54x DSP Reference Set, vol. 1: CPU and Peripherals", Literature No. SPRU131F, Apr. 1999, pp. 2-1 through 2-16 and 4-1 through 4-29.

Tisserand, A., et al., "An on-line arithmetic based FPGA for low power custom computing," *Field Programmable Logic and Applications, 9th International Workshop, FPL'99, Proceedings* (*Lecture Notes in Computer Science* vol. 1673), Lysaght, P., et al., eds., Aug. 30-Sep. 1, 1999, pp. 264-273.

Tralka, C., "Symbiosis of DSP and PLD," *Elektronik*, vol. 49, No. 14 , Jul. 11, 2000, pp. 84-96.

Valls, J., et al., "A Study About FPGA-Based Digital Filters," *Signal Processing Systems*, 1998, SIPS 98, 1998 IEEE Workshop, Oct. 10, 1998, pp. 192-201.

"Virtex-II 1.5V Field-Programmable Gate Arrays", *Xilinx*, Jan. 25, 2001, module 2 of 4.

"Virtex-II 1.5V Field-Programmable Gate Arrays", *Xilinx*, Apr. 2, 2001, module 1 of 4.

"Virtex-II 1.5V Field-Programmable Gate Arrays", *Xilinx*, Apr. 2, 2001, module 2 of 4.

Walters, A.L., "A Scaleable FIR Filter Implementation Using 32-bit Floating-Point Complex Arithmetic on ,a FPGA Based Custom Computing Platform," Allison L. Walters, Thesis Submitted to the Faculty of Virginia Polytechnic Institute and State University, Jan. 30, 1998.

Weisstein, E.W., "Karatsuba Multiplication," *MathWorld—A Wolfram Web Resource* (Dec. 9, 2007), accessed Dec. 11, 2007 at http://mathworld.wolfram.com/KaratsubaMultiplication.html.

Wenzel, L., "Field programmable gate arrays (FPGAs) to replace digital signal processor integrated circuits," *Elektronik* , vol. 49, No. 5, Mar. 7, 2000, pp. 78-86.

"Xilinx Unveils New FPGA Architecture to Enable High-Performance, 10 Million System Gate Designs", *Xilinx*, Jun. 22, 2000.

"Xilinx Announces DSP Algorithms, Tools and Features for Virtex-II Architecture", *Xilinx*, Nov. 21, 2000.

Xilinx Inc., "Virtex-II 1.5V Field-Programmable Gate Arrays", Advance Product Specification, DS031-2 (v1.9), Nov. 29, 2001, Module 2 of 4, pp. 1-39.

Xilinx Inc., "Using Embedded Multipliers", Virtex-II Platform FPGA Handbook, UG002 (v1.3), Dec. 3, 2001, pp. 251-257.

Xilinx, Inc., "A 1D Systolic FIR," copyright 1994-2002, downloaded from http://www.iro.umontreal.ca/~aboulham/F6221/Xilinx%20A%201D%20systolic%20FIR.htm.

Xilinx, Inc., "The Future of FPGA's," White Paper, available Nov. 14, 2005 for download from http://www.xilinx.com/prs_rls,5yrwhite.htm.

\* cited by examiner 204, 220, 232, 242, 248, 258, 254, 264, 410, ET

DIGITAL SIGNAL PROCESSING CIRCUITRY WITH REDUNDANCY AND ABILITY TO SUPPORT LARGER MULTIPLIERS

BACKGROUND OF THE INVENTION

This invention relates to digital signal processing ("DSP") circuitry, and more particularly to arrays of DSP circuit modules or blocks that can individually and/or collectively perform DSP operations such as multiplications that are larger than the individual multiplier components in those blocks. Another possible aspect of the invention is to employ redundancy so that when two or more DSP blocks must work together, that can still be accomplished even if there is a circuit defect that makes some DSP block(s) unusable.

Various circumstances may call for an integrated circuit to be fabricated with multiple instances of blocks or modules of DSP circuitry. An example of such an integrated circuit is a programmable logic device ("PLD") or a field-programmable gate array ("FPGA"). Such a device may have a plurality of rows of various kinds of circuitry, such as relatively general-purpose logic. Each such row may also include a block of DSP circuitry (i.e., circuitry that is hard-wired to at least some degree to perform a particular DSP function or a particular set of DSP functions). It can be desirable in such a situation to size the DSP blocks so that they fit within the (row) boundaries of the other circuitry in the row. This may mean that a DSP block is too small, by itself, to perform some DSP functions that it may be desired for the integrated circuit to perform. In such cases it would be desirable to facilitate optimal "stitching together" of multiple DSP blocks in various ways so that larger DSP functions can be efficiently performed in two or more DSP blocks. However, a countervailing concern may be that if any portion of the circuitry associated with DSP blocks that need to be stitched together is not usable (e.g., because of a manufacturing defect in the integrated circuit), that can make it much more difficult or impossible to stitch together those DSP blocks. This may greatly increase the chances that a partly defective integrated circuit cannot be used at all.

Another possible consequence of trying to make a DSP block no larger than will fit within the (row) boundaries of other circuitry in a row on an integrated circuit device like a PLD is that this can make it more difficult for the integrated circuit device to meet the growing need for arithmetic operations having greater arithmetic precision. Greater arithmetic precision means performing arithmetic operations that extend to a greater number of numerical "places," i.e., that include more digits. For example, the multiplication of an 18-bit multiplicand by an 18-bit multiplier (a so-called 18×18 multiplication) nominally produces a 36-bit product. But a 27×27 multiplication nominally produces a 54-bit product. If DSP blocks on an integrated circuit are designed to perform 18×18 multiplication, it can take several such blocks, working together, to perform a 27×27 multiplication. This can be relatively inefficient and "expensive" in terms of resources consumed. Even if full 54-bit products from such 27×27 multiplications are not needed, there can still be inefficient and expensive use of DSP resources involved in producing "truncated" products of such larger multiplications in multiple DSP blocks that are designed to individually fit within one row of other circuitry.

SUMMARY OF THE INVENTION

In accordance with certain possible aspects of the invention, digital signal processing ("DSP") block circuitry may include first and second multiplier circuits. The DSP block circuitry may further include first circuitry for selectively shifting bit positions of output signals of the first multiplier circuit relative to bit positions of output signals of the second multiplier circuit. The DSP block circuitry may still further include first circuitry for selectively additively combining output signals of the first circuitry for selectively shifting and the second multiplier circuit. The second multiplier circuit may include first and second sub-multiplier circuits. The second multiplier circuit may further include second circuitry for selectively shifting bit positions of output signals of the first sub-multiplier circuit relative to bit positions of output signals of the second sub-multiplier circuit. The second multiplier circuit may still further include second circuitry for additively combining output signals of the second circuitry for selectively shifting and the second sub-multiplier circuit.

Circuitry of the type described above may further include routing circuitry for deriving one set of input signals to the second sub-multiplier circuit from a selectable one of (1) one set of input signals to the first sub-multiplier circuit and (2) one set of input signals to the first multiplier circuit.

Circuitry of the type described in the above first Summary paragraph may further include third circuitry for selectively shifting bit positions of output signals of the second circuitry for additively combining relative to bit positions of output signals of the first multiplier circuit.

Circuitry of the type described in the above first Summary paragraph may further include circuitry for selectively keeping output signals of the first multiplier circuit separate from other signals in the first circuitry for selectively additively combining so that the first circuitry for selectively additively combining does not additively combine the output signals of the first and second multiplier circuits if desired.

Circuitry of the type described in the above first Summary paragraph may further include first routing circuitry for selectively routing output signals of the first multiplier circuit to a first other instance of the DSP block circuitry. This circuitry may still further include second routing circuitry for selectively routing signals received from the first routing circuitry of a second other instance of the DSP block circuitry to the first circuitry for selectively additively combining.

Circuitry of the type described in the preceding paragraph may further include third routing circuitry for selectively routing output signals of the second multiplier circuit to the second other instance of the DSP block circuitry. In such a case, the second routing circuitry can alternatively selectively route signals received from the third routing circuitry of the first other instance of the DSP block circuitry to the first circuitry for selectively additively combining.

In circuitry of the type described in the paragraph prior to the last paragraph, the first circuitry for selectively additively combining may include fourth circuitry for selectively shifting bit positions of signals representing an additive combination of output signals of the first circuitry for selectively shifting and the second multiplier circuit relative to output signals of the second routing circuitry.

In circuitry of the type defined in the above first Summary paragraph, the first circuitry for selectively additively combining may include fifth circuitry for selectively shifting bit positions of signals to eliminate data in bit positions below a predetermined threshold of arithmetic significance.

In circuitry of the type defined in the above first Summary paragraph, the first multiplier circuit may be an 18×18 multiplier circuit, and each of the first and second sub-multiplier circuits may be a 9×18 multiplier circuit.

In circuitry of the type described in the preceding paragraph the second circuitry for selectively shifting and the second circuitry for additively combining can cooperate to cause the second multiplier circuit to operate as an 18×18 multiplier circuit.

In circuitry of the type described in the preceding paragraph, the second circuitry for selectively shifting and the second circuitry for additively combining can alternatively cooperate to cause the second multiplier circuit to produce a sum of two 9×18 multiplications.

In circuitry of the type described in the preceding paragraph, the first and second multiplier circuitry and the first circuitry for selectively additively combining can cooperate to produce a product of a 27-bit multiplicand times a 27-bit multiplier, except for a partial product of 9 less significant bits of the multiplicand times 9 less significant bits of the multiplier.

In circuitry of the type described in the preceding paragraph, the first circuitry for selectively additively combining may include circuitry for selectively truncating the product to its 27 more significant bits.

In circuitry of the type described in the paragraph before the last one, the first circuitry for selectively additively combining may include circuitry for selectively receiving the partial product from another instance of the DSP circuitry so that the product can include the partial product.

In accordance with certain other possible aspects of the invention, a system such as an integrated circuit may include a plurality of digital signal processing ("DSP") block circuits. Each DSP block circuit may include first and second multiplier circuits. Each DSP block circuit may further include first routing circuitry for outputting signals from a selectable one of (1) the first multiplier circuit in a first other one of the DSP block circuits and (2) the second multiplier circuit in a second other one of the DSP block circuits. Each DSP block circuit may still further include first circuitry for selectively additively combining output signals of the first and second multiplier circuits and the first routing circuitry with selectable relative arithmetic significance.

In circuitry of the type described in the preceding paragraph, the first routing circuitry may obtain output signals from the first multiplier circuitry in the first other one of the DSP block circuits prior to any operation on those output signals by the first circuitry for selectively additively combining in the first other one of the DSP block circuits.

In accordance with still other possible aspects of the invention, digital signal processing ("DSP") block circuitry may include first and second multiplier circuits. The DSP block circuitry may further include first circuitry for selectively additively combining output signals of the first and second multiplier circuits with selectable relative arithmetic significance. The second multiplier circuit may include first and second sub-multiplier circuits. The second multiplier circuit may further include second circuitry for additively combining output signals of the first and second sub-multiplier circuits with selectable relative arithmetic significance.

Circuitry of the type described in the preceding paragraph may further include routing circuitry for driving one set of input signals to the second sub-multiplier circuit from a selectable one of (1) one set of input signals to the first sub-multiplier circuit and (2) one set of input signals to the first multiplier circuit.

In circuitry of the type described in the paragraph prior to the last one, the first circuitry for selectively combining may be alternatively able to output separate first and second product signals for the first and second multiplier circuits, respectively.

In circuitry of the type described three paragraphs earlier, the first circuitry for selectively combining may be able to selectively truncate signals having arithmetic significance below a predetermined threshold level.

Further features of the invention, its nature and various advantages, will be more apparent from the accompanying drawings and the following detailed description.

DETAILED DESCRIPTION

Figure 1:
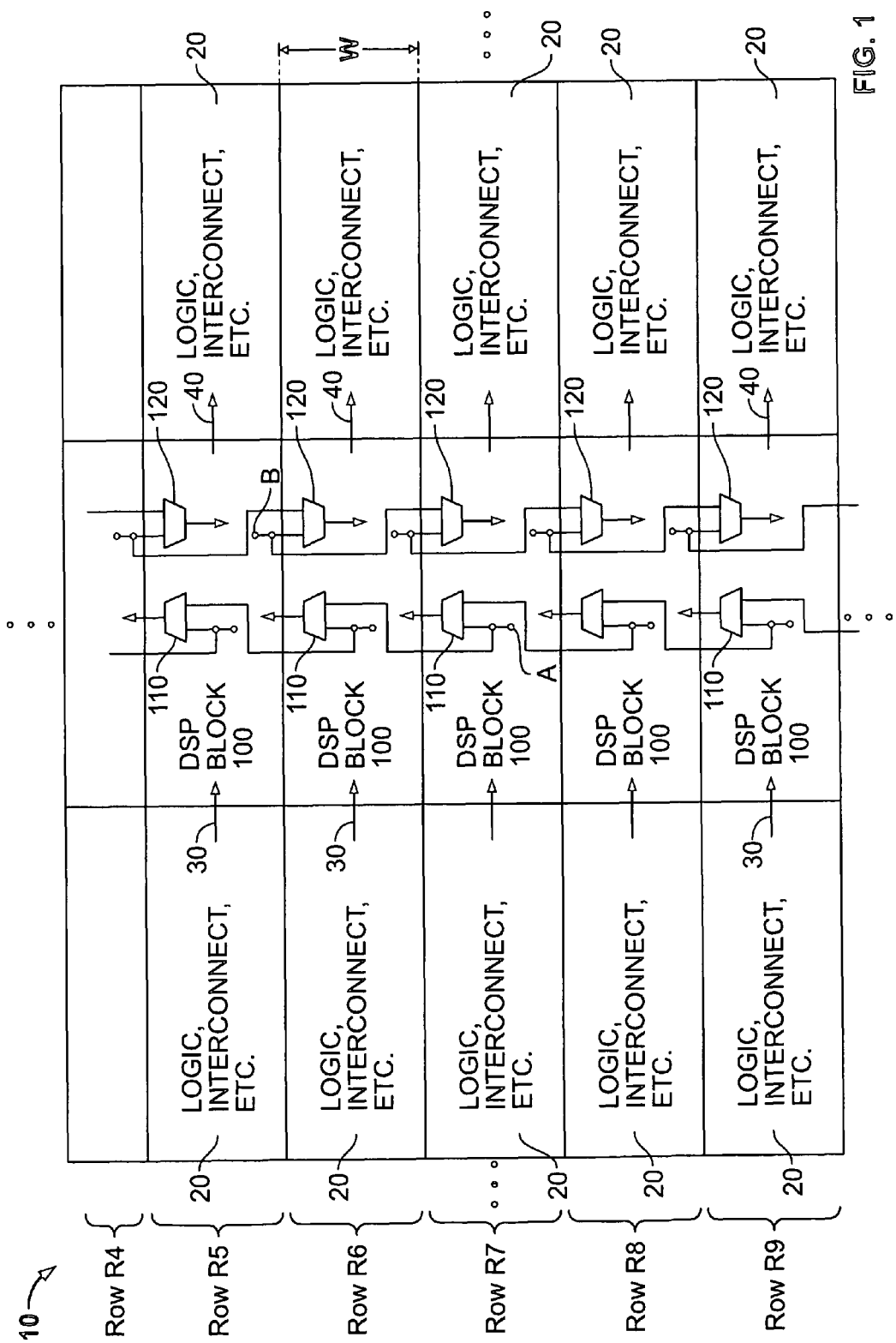
FIG. 1 is a simplified schematic block diagram of an illustrative embodiment of representative circuitry in accordance with the invention.

A representative portion of an illustrative embodiment of an integrated circuit ("IC" or "device") 10 in accordance with the invention is shown in FIG. 1. The circuitry shown in FIG. 1 includes representative portions of several representative rows R4 through R9 of circuitry. Any one of these rows may be referred to generally as row RN.

Each row RN includes a block of digital signal processing or DSP circuitry 100. Each row RN also includes areas of other circuitry 20 to the left and right of the DSP block in that row. That other circuitry 20 may include such components as logic circuitry and interconnection conductors for conveying signals to and from that row's DSP block, and also to, from, and between that row's logic and other circuitry, as well as between the rows. Various aspects of some or all of this circuitry may be programmable, e.g., to enable a generic device 10 to be put to any of several different uses. For example, although the circuitry of DSP blocks 100 is typically hard-wired to some extent to perform certain DSP functions, that circuitry may also be programmable to some extent so that certain aspects of the DSP operations performed can be varied by different users of the device to meet each user's particular needs and requirements. Such programming may be the result of storing control data in memory cells on the integrated circuit, blowing fuses on the integrated circuit, mask programming of the integrated circuit, or any other suitable programming technique or technology.

Device 10 may be constructed so that the rows are redundant. This means, for example, that each row RN is identical or substantially identical to all other rows. In addition, device 10 may be constructed so that if any row RN is defective, the row immediately above or below that row can effectively take the place of the defective row. In addition, all other rows above or below the row that is effectively taking the place of the defective row effectively replace other adjacent rows. In this way, many devices 10 that are inadvertently manufactured with some defective circuitry can still be used, which significantly increases the yield of the manufacturing process. FIG. 1 shows representative circuitry for achieving this redundancy in the DSP block areas 100. Additional redundancy circuitry is provided for other portions of each row RN but is not shown in FIG. 1 to avoid over-complicating the drawings (and because those other portions of the rows are not the primary focus of this invention). The DSP block redundancy circuitry will be described in general terms in the next several paragraphs.

In accordance with certain possible aspects of the invention, a DSP block 100 can extend its functionality by sending certain signals to and/or receiving certain signals from an adjacent DSP block or blocks. These are relatively direct connections between adjacent DSP blocks 100. These inter-DSP-block connections do not rely on other, more general, interconnection resources of device 10 such as the interconnection resources that form part of circuitry 20. Rather, these inter-DSP-block connections go directly from one DSP block 100 to another adjacent DSP block 100, subject only to the possibility that the redundancy circuitry that will now be described may be employed to allow these inter-DSP-block signals to effectively "jump over" a row that has been taken out of service due to one or more defects in that row.

Considering representative row R7 as an example, a signal that needs to go (in accordance with certain possible aspects of this invention) from the DSP block 100 in row R7 to another DSP block may originate at node A in the row R7 DSP block. This signal is applied to one selectable input terminal of the multiplexer circuitry ("mux") 110 in that DSP block, and also to one selectable input terminal of the similar mux 110 in the DSP block 100 in the row R6 above row R7. The output signal of mux 110 in row R7 goes to a destination in the DSP block 100 in row R6.

The output of mux 110 in row R6 goes to a destination in the DSP block 100 in row R5. If row R6 is not defective and is therefore in use, the mux 110 in row R7 is controlled to select the signal from node A for application to row R6. But if row R6 is defective and is therefore effectively cut out of the circuitry of device 10, then mux 110 in row R6 is controlled to select the signal from node A for application to row R5. This example shows how redundancy muxes 110 can be used to apply a signal from the DSP block 100 in any row to the DSP block 100 in the row immediately above or to the DSP block 100 two rows above the source row.

Redundancy muxes 120 can be used similarly to route a signal from any DSP block 100 to either the DSP block 100 immediately below or the DSP block 100 two rows below. For example, a signal that originates at node B in the DSP block 100 in row R5 is applied to one selectable input of the muxes 120 in each of rows R6 and R7. If row R6 is in use, the mux 120 in row R6 is controlled to apply the signal from node B to the destination in row R6. On the other hand, if row R6 is not in use, then the mux 120 in row R7 is controlled to apply the signal from node B to the destination in row R7.

Figure 2:
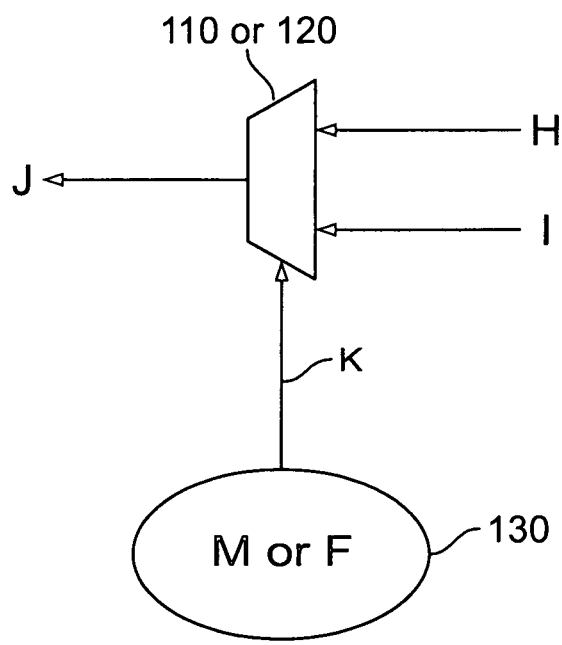
FIG. 2 is a simplified schematic block diagram of an illustrative embodiment of circuitry that can be used in FIG. 1 type circuitry in accordance with the invention.

FIG. 2 shows illustrative embodiments of how a representative redundancy mux 110 or 120 may be controlled. Mux 110/120 can select either of its primary or selectable inputs H or I to be its output signal J based on the logical state of its selection control input signal K. For example, if K is zero, J may be H; and if K is one, J may be I. K may come from a fuse (F) 130 on device 10, memory cell (M) 130 on the device, or any other programmable feature 130 on the device. Such a fuse, memory cell, or the like 130 may be programmed to the appropriate state for each such element 130 after it has been determined which (if any) row RN is defective and must therefore be effectively cut out of device 10 for purposes of normal use of the device.

A point to be made in connection with FIG. 1 is that the width W of each row (between adjacent rows) is approximately the same for (1) the DSP block 100 in that row and (2) the other circuitry 20 in that row. This facilities efficient use of the area on device 10 in a context, like the present one, in which each row is substantially identical to the other rows and in which any row may be completely taken out of service (if defective) and seamlessly replaced by another row. When a row is thus taken out of service and replaced by another row, all functions of the original row are preferably automatically reassigned to the replacement row. The user of the device does not need to be concerned with, or even know, which rows are being used and which row is not being used.

A possible consequence of making the height of each DSP block 100 the same as the height of other circuitry 20 in a row is that it tends to force the size or functional capacity of each DSP block to be commensurate with the size and capacity of the adjacent other circuitry 20 in the row that includes that DSP block. For example, a DSP block 100 may only be able to get a certain number of input signals from the adjacent circuitry 20 in the row that includes that DSP block. This may limit the number and/or size of the DSP operations (e.g., multiplications) the DSP block can perform. However, some users of device 10 may want to perform larger multiplications than can be performed in one such limited DSP block. The present invention therefore provides for extending the multiplication and other capacities of one DSP block 100 by, for example, certain modifications to the circuitry of each DSP block, and/or allowing some portions or aspects of a large multiplication and/or other DSP operation to be performed in another adjacent DSP block 100. In accordance with the present invention, this is done by sending signals substantially directly between adjacent DSP blocks, e.g., via redundancy circuitry like that shown in general at 110 and 120 in FIG. 1. Substantially direct inter-DSP-block connections are used in this way to avoid the delay and possible other resource exhaustion that might result from instead attempting to use the more general-purpose interconnection resources of other circuitry 20. Redundancy like 110 and 120 is preferably used in these inter-DSP-block interconnections so that if a row must be taken out of service, the signals that need to go from one DSP block 100 to another can bypass the non-functioning DSP block 100 in the row that has been taken out of service.

Figure 3:
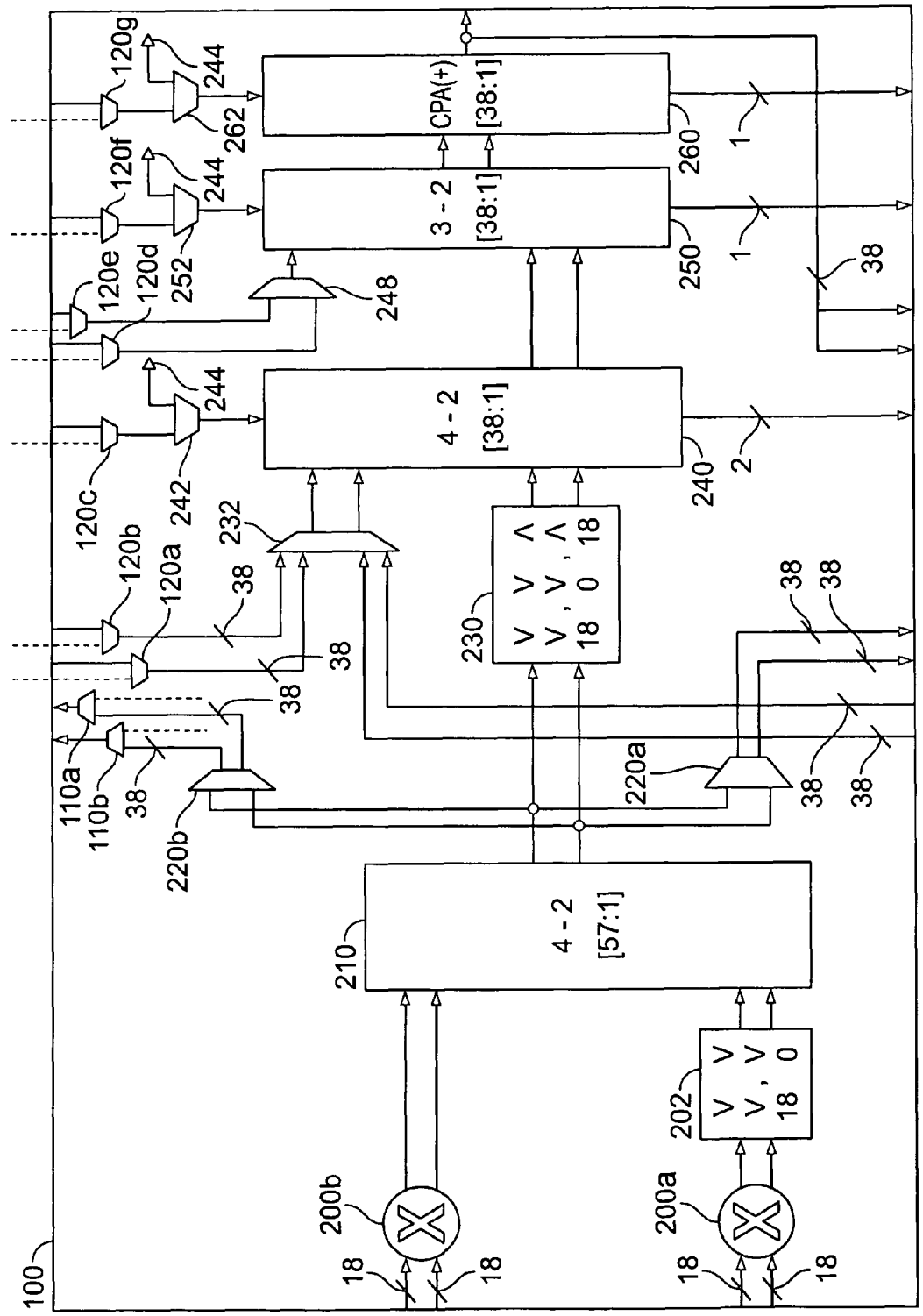
FIG. 3 is a more detailed, but still simplified, schematic block diagram of an illustrative embodiment of a representative portion of circuitry of the type shown in FIG. 1.

FIG. 3 shows an illustrative embodiment of a DSP block 100 that can serve as a starting point for discussion of further possible aspects of the present invention. FIG. 3 is the same as FIG. 3 in commonly assigned U.S. patent application Ser. No. 12/380,841, filed concurrently herewith, and now U.S. Pat. No. 8,805,916. The various elements of DSP block 100 will be identified early in what follows. More details regarding how these elements can be used will be provided later.

Figure 4:
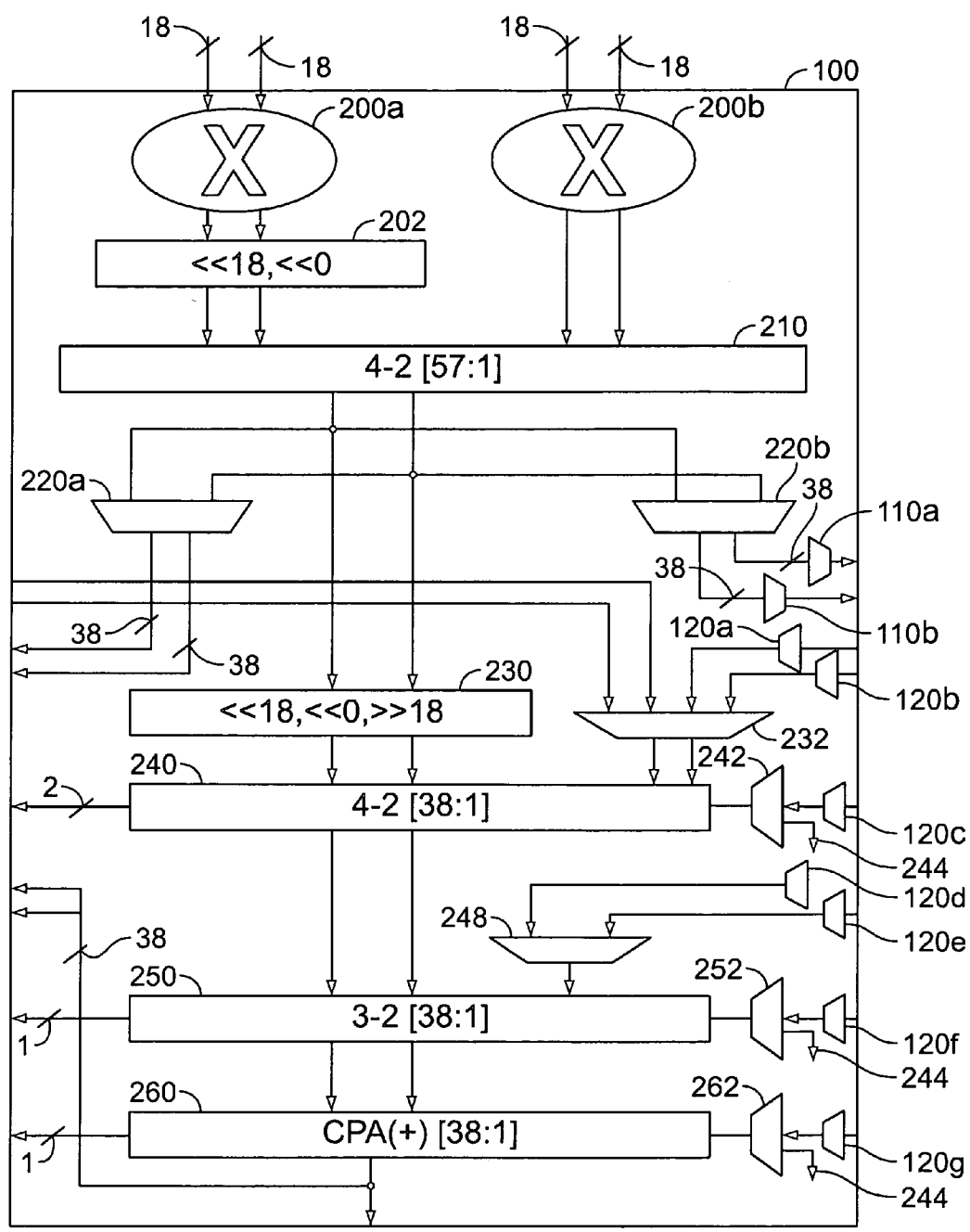
FIG. 4 shows the FIG. 3 circuitry rotated clockwise 90° to facilitate some aspects of discussion of that circuitry.

FIG. 3 shows representative DSP block 100 in the same orientation as is shown in FIG. 1. However, because this orientation can be difficult to talk about when it comes to explaining arithmetic operations performed by various components of the DSP block, the substance of FIG. 3 is exactly reproduced in a different orientation in FIG. 4. In particular, FIG. 4 is rotated clockwise 90° relative to FIG. 3. Thus "left" or the like in FIG. 4 is the same as "bottom," "down," "below," or the like in FIG. 3; "right" or the like in FIG. 4 is the same as "top," "up," "above," or the like in FIG. 3, etc. FIGS. 1 and 3 make it clear that the above-mentioned substantially direct connections between adjacent DSP blocks 100 go from row to row in device 10. Although FIGS. like FIG. 4 depict a representative DSP block 100 rotated 90°, the following discussion of FIGS. like FIG. 4 will still refer to such inter-DSP-block signals going from one "row" to another "row", even though FIGS. of this kind may make it appear that signals traveling left or right are going into another column of circuitry rather than into another row of circuitry.

Turning now to the basic structure of representative DSP block 100 as shown in either FIG. 3 or FIG. 4, block 100 includes two 18 by 18 ("18×18") multiplier circuits 200a and 200b. Each of multipliers 200 can multiply together two 18-bit data words (represented by electrical data signals from the other circuitry 20 in the row that includes the DSP block 100 under consideration) and produce two product vectors (again represented by electrical signals) in redundant format (e.g., one 36-bit sum vector and one 36-bit carry vector (because the multiplier does not include a final carry-propagate adder ("CPA") for producing a normal final product value)). Controllable shifter circuit 202 is controllable to shift the sum and carry signal vectors output by multiplier 200a either (1) 18 bit positions to the left (increased numerical or arithmetic significance), or (2) not at all (i.e., no shift to the left and therefore no change in numerical or arithmetic significance). Another possible output condition for element 202 may be outputting data signals that are all zeros. As in the case of FIG. 2, one or more fuses or memory cells like 130 may be programmed to control element 202 with respect to whether or not to shift the outputs of multiplier 200a to the left as described above (or, as a third possibility, to output 0 data as mentioned above). As another possible alternative, element 202 may be mask-programmable with respect to the function it performs. In all cases throughout this specification, "shifting" typically means routing signals to a different set of electrical leads going to the next downstream circuit element than the set of electrical leads that would otherwise be used to convey those signals (if not shifted) to the next downstream circuit element. The "arithmetic significance," "bit position," "order," or the like of a bit signal is typically the result of which of several electrical leads that signal is on.

The next element in representative DSP block 100 is four-to-two ("4-2") compressor circuit 210. Compressor 210 can combine the two sum and carry signal vectors it receives from each of shifter 202 and multiplier 200b (i.e., a total of four such signal vectors) down to two such signal vectors.

Because the vectors from shifter 202 may be increased in numerical significance by 18 bit positions, the "width" of compressor 210 needs to be increased to 57 bits. Hence compressor 210 is shown having 57 bit positions (i.e., [57:1]).

The sum and carry vectors output by compressor 210 (each vector possibly including as many as 57 bits) are applied to muxes 220a and 220b, and also to controllable shifter circuit 230. Mux circuitry 220a can select any one of various 38-bit subsets of the 57-bit signal vectors output by compressor 210 for application to an adjacent DSP block to the left as viewed in FIG. 4. (Throughout this discussion, the bits in all such 38-bit data values or subsets are of consecutive numerical significance. For example, they may be relatively low-order bits from the 57-bit source; or they may be relatively high-order bits from that source. But in either case, they all have successive bit significance. Selecting such a subset is typically the result of selecting which one of several groups of electrical leads is selected as the source of the signals in the selected subset.) Similarly, mux circuitry 220b can select any one of various 38-bit subsets of the 57-bit vectors output by compressor 210 for application to an adjacent DSP block to the right as viewed in FIG. 4. Muxes 220a and 220b may also have the ability to output data that is all zeros, if desired. This is a capability that any of the muxes (e.g., 220, 232, 242, 248, etc.) and any of the controllable shifters (e.g., 202, 230, etc.) shown and described throughout this disclosure may have. Some muxes (e.g., 242, 252, and 262) are depicted with this capability explicitly shown (e.g., the connection to ground 244 of one set of the selectable inputs to these muxes). This circuitry is not repeated for the depiction of all other elements (e.g., 202, 220, 230, 232, 248, etc.) that may include it (to avoid over-complicating the drawings), nor is this capability expressly mentioned again in the discussion of all of these other elements, but it will be understood that all elements of these general kinds may have this capability.

Controllable shifter 230 can shift bits applied to it by 18 bits to the left (thereby increasing the numerical significance of those bits), or by 18 bits to the right (thereby decreasing the numerical significance of those bits). As a third alternative, shifter 230 may apply no shift to the data applied to it. All of elements 220 and 230 may be controlled by programmable fuse or memory circuit elements like 130 in FIG. 2 (or may be mask programmable) to select which of their various possible functions to perform.

Note that in order to exit the representative DSP block 100 shown in FIGS. 3 and 4, the outputs of muxes 220b must be selected by redundancy muxes 110a and 110b (which are specific instances of redundancy muxes 110 shown more generally or generically in FIGS. 1 and 2). The alternative inputs to muxes 110a and 110b are shown by dotted lines and only in part in FIG. 3 and not at all in FIG. 4 (to avoid over-complicating FIGS. 3 and 4). But it will be apparent from FIG. 1 that these dotted line inputs come from the muxes 220b in the DSP block 100 below the FIG. 3 DSP block (or to the left of the FIG. 4 DSP block).

Muxes 232 receive 38-bit sum and carry vectors from redundancy muxes 120a and 120b. Again, redundancy muxes 120a and 120b are specific instances of the type of redundancy muxes that are shown more generally or generically at 120 in FIG. 1. The solid line inputs to muxes 120a and 120b come from the muxes 220a in the DSP block 100 immediately above the FIG. 3 DSP block (or immediately to the right of the FIG. 4 DSP block). The alternative dotted line inputs to muxes 120a and 120b (shown only in part in FIG. 3 and not at all in FIG. 4 to avoid over-complicating FIGS. 3 and 4) come from the muxes 220a in the DSP block 100 two above the FIG. 3 DSP block (or two to the right of the FIG. 4 DSP block). Muxes 232 also receive 38-bit sum and carry signal vectors from leads that come from the redundancy muxes 110a and 110b in the DSP block 100 immediately below the FIG. 3 DSP block (or immediately to the left of the FIG. 4 DSP block). Muxes 232 can select either the vectors from muxes 120a and 120b or the other vectors that muxes 232 receive. Control of muxes 232 can be similar to control of other variable elements like muxes 220.

The next element in the representative DSP block 100 shown in FIGS. 3 and 4 is 4-2 compressor circuit 240. Although different in size, compressor 240 can be similar to compressor 210. In other words, compressor 240 can combine the four 38-bit sum and carry signal vectors it receives into two, further, 38-bit sum and carry signal vectors. In the event that larger multiplications are being performed, compressor 240 may need to operate in chain-like conjunction with the similar compressor 240 in another adjacent DSP block 100. Accordingly, compressor 240 can additionally receive lower-order (i.e., lower-numerical-significance) signal bits from muxes 242. Muxes 242 can select these lower-order bits from a source of ground potential 244 in the event that there is no chaining-in from a real lower-order source. Alternatively, if there is such chaining-in, then muxes 242 get their outputs from redundancy muxes 120c. Muxes 120c are another instance of muxes like 120a and 120b. The solid line inputs to muxes 120c are the two outputs from compressor 240 in the DSP block 100 immediately above the FIG. 3 block (or immediately to the right of the FIG. 4 block). The dotted line inputs to muxes 120c (shown only in part in FIG. 3 and omitted entirely from FIG. 4 to avoid over-complication of the depictions) are the two outputs from the compressor 240 in the DSP block 100 two above the FIG. 3 block (or two to the right of the FIG. 4 block). The two outputs that come off the bottom (FIG. 3) or left (FIG. 4) of compressor 240 are the most significant, highest order, or overflow output signal bits that result from the operations performed by compressor 240. Again, these overflow bits can be chained to the lowest order inputs of an adjacent DSP block's compressor 240 via muxes 120c and 242 in that adjacent block if larger multiplications are being performed. (If there is no chaining of the DSP blocks, muxes 232 can be controlled to output 0 data.)

The 38-bit sum and carry vectors output by compressor 240 are applied to three-to-two ("3-2") compressor circuit 250. The final product output by an adjacent DSP block 100 can also be applied to 3-2 compressor 250 via redundancy muxes 120d and 120e and muxes 248. Again, this inter-DSP-block routing feature can be used when certain more complex DSP operations are to be performed. The arrangement and use of muxes 120d and 120e are similar to the arrangement and use of other such muxes like 120a and 120b. Thus the solid line inputs to muxes 120d and 120e come from the primary outputs of the carry-propagate adder (CPA) circuit 260 in the DSP block 100 above (FIG. 3) or to the right (FIG. 4) of the block shown in FIGS. 3 and 4. The alternative dotted line inputs to redundancy muxes 120d and 120e (again shown only in part in only FIG. 3) come from the primary outputs of the CPA 260 in the DSP block 100 two above (FIG. 3) or two to the right (FIG. 4) of the FIGS. 3 and 4 block. 3-2 compressor 250 can combine the sum and carry signal vectors from compressor 240 with the data output by muxes 248 to produce further sum and carry signal vectors that are applied to final carry-propagate adder ("CPA") 260. (If muxes 248 are not needed, they can be controlled to output 0 data.) In the event that the representative DSP block 100 is involved in a longer-than-38-bit arithmetic operation, lower-order signal bits can be applied to compressor 250 and CPA 260 from an adjacent DSP block 100 via muxes 120f and 252 in the case of compressor 250 and via muxes 120g and 262 in the case of CPA 260. Similarly, higher-order signal bits can be output from elements 250 and 260 to the elements 120f/252/250 and 120g/262/260 in an adjacent DSP block 100 if needed for chaining multiple elements 250 and multiple elements 260 for longer arithmetic operations. The arrangement and use of elements 120f, 252, and 244 can be similar to the above-described arrangement and use of elements 120c, 242, and 244. The same is true for elements 120g, 262, and 244. Accordingly, further explanation of elements 120f/252/244 and 120g/262/244 should not be needed.

In addition to being substantially directly routable back to muxes 248 in another adjacent DSP block 100, the final, up-to-38-bit signal product output by CPA 260 is typically applied to the other circuitry 20 in the row RN that includes representative DSP block 100 as shown in FIG. 1.

The above-mentioned Langhammer et al. reference explains various modes of operation that circuitry of the type shown in FIGS. 3 and 4 can support. For example, these modes can include (1) 18×18 multiplication, (2) sum of four 18×18 multiplications, (3) sum of two 36×18 multiplications, (4) 36×36 multiplication, and (5) 54×54 multiplication. The following FIGS. and discussion show modifications to the above-described "basic" circuitry that can facilitate the performance of other types of operations. These modifications do not disable the above-described operating modes, but rather add more operating modes to capabilities of the circuitry (especially modes that include handling multiplications in which one or both of the numbers to be multiplied include 27 bits).

Figure 5:
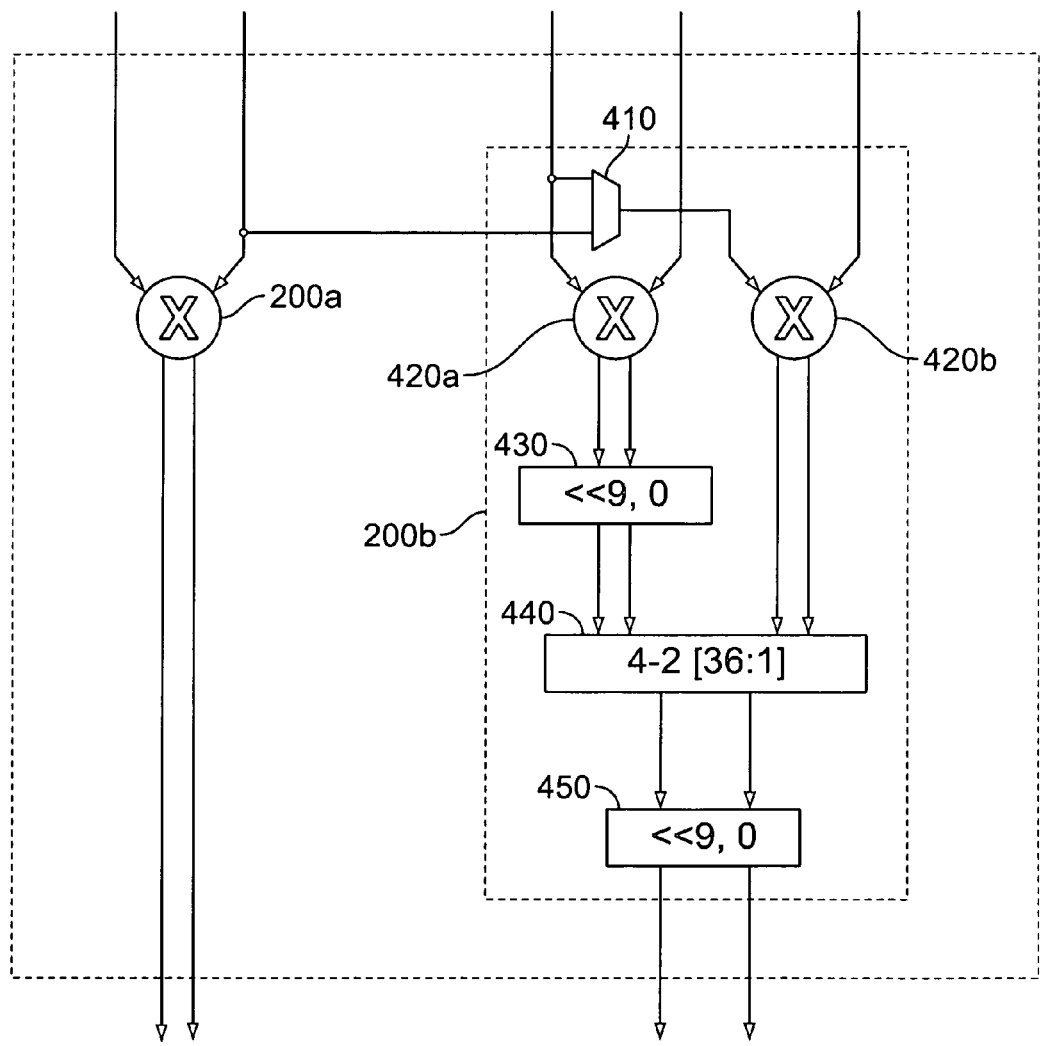
FIG. 5 is a simplified schematic block diagram of an illustrative embodiment of possible modifications of the FIG. 4 circuitry in accordance with the invention.

FIG. 5 shows modifications that can be made to the basic DSP block 100 to give that block certain 27×27 multiplier capabilities. Multiplier 200a remains unaltered from basic block 100. However, multiplier 200b is provided as two 9×18 multipliers 420a and 420b. Mux 410 is added to allow either (a) one of the 18-bit inputs to multiplier 200a or (b) the 18-bit input to multiplier 420a to be selected as the 18-bit input to multiplier 420b. Controllable shifter 430 is added to allow the 27-bit outputs of 9×18 multiplier 420a to be either (a) shifted left by 9 bit positions or (b) passed through without any such shift. 4-2 compressor 440 can compress (i.e., partially add) the four vectors output by elements 430 and 420b to produce two further vectors. The output of compressor 440 is 36 bits wide. However, the lower 9 bits of the outputs of multiplier 420b do not need to be compressed with any contribution (i.e., non-zero data) from element 430. Thus these 9 lower-order bits from element 420b can just pass through element 440, and element 440 does not need to include any logic for manipulating those bits. The logic size of element 440 can therefore be only 27 bits. Controllable shifter 450 is added to allow the outputs of compressor 440 to be either (a) shifted left by 9 bit positions or (b) passed through without any such shift.

Some of the modes that are possible in DSP block 100 with multiplier 200b modified as shown in FIG. 5 are illustrated in subsequent FIGS. and described below.

Figure 6:
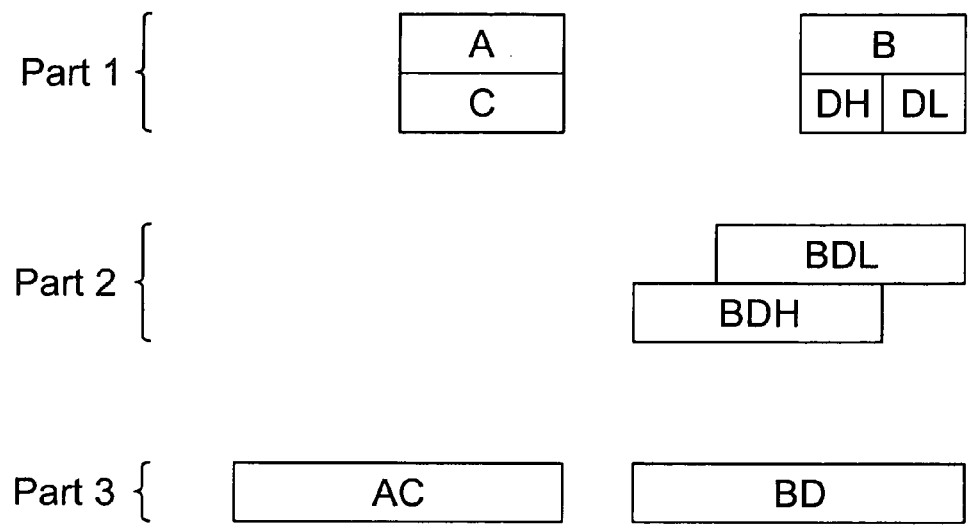
FIG. 6 is a simplified diagram illustrating certain aspects of performance of a particular DSP operation in accordance with the invention.

Firstly, it should be understood that the above-described modifications to multiplier 200b do not take away any of the previous capabilities of DSP block 100. For example, DSP block is still capable of performing two 18×18 multiplications, as is shown by FIG. 6. Part 1 of FIG. 6 shows the two 18-bit multiplications to be performed, namely (1) multiplication of 18-bit word A by 18-bit word C, and (2) multiplication of 18-bit word B by 18-bit word D (consisting of 9 more-significant bits DH and 9 less-significant bits DL). Multiplication of A by C is performed in 18×18 multiplier 200a. Multiplication of B by DH is performed in 9×18 multiplier 420a. Multiplication of B by DL is performed in 9×18 multiplier 420b. (Mux 410 is controlled to apply B to the 18-bit inputs of both of multipliers 420a and 420b.) Controllable shifter 430 is used to shift the vectors of product B*DH 9 bit positions to the left relative to B*DL as shown in Part 2 of FIG. 6. This properly aligns the vectors from elements 430 and 420b for compression (addition) by compressor 440. The vectors output by multiplier 200a represent the product AC as shown in Part 3 of FIG. 6. Similarly, the vectors output by compressor 440 represent the product BD, as is also shown in Part 3 of FIG. 6. No bit-position shift by controllable shifter 450 is required in this mode of operation. The outputs of elements 200a and 450 in FIG. 5 are the same as the outputs of multipliers 200a and 200b in basic DSP block 100, and the remaining basic DSP block 100 circuitry is available for further processing these outputs in any desired way.

We now describe a new mode of operation that the FIG. 5 circuitry adds to the capabilities of a DSP block 100 that includes the FIG. 5 circuitry. This new mode is a species of 27×27 multiplication as shown in FIG. 7.

Figure 7:
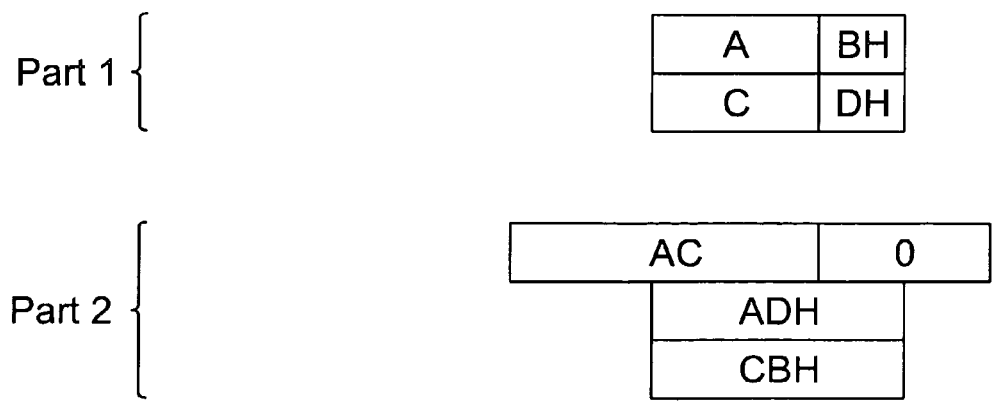
FIG. 7 is similar to FIG. 6 for another DSP operation in accordance with the invention.

Part 1 of FIG. 7 shows the multiplication to be performed. This is multiplication of 18-bit word A and 9-bit word BH by 18-bit word C and 9-bit word DH. The product sought in this mode is only approximate, because the partial product BH*DH will be neither computed nor used to produce the (approximate) final product. However, such an approximate final product will be sufficiently accurate for a great many uses of the circuitry. The omission of partial product BH*DH is indicated by the "0" data in Part 2 of FIG. 7. The manner in which the circuitry (including the FIG. 5 modification of multiplier 200b) performs this species of 27×27 multiplication will now be described.

Multiplier 200a performs the 18×18 multiplication of A and C. A is also applied to the 18-bit input of multiplier 420a, and mux 410 is used to apply C to the 18-bit input of multiplier 420b. DH is applied to the 9-bit input of multiplier 420a, and BH is applied to the 9-bit input of multiplier 420b. Accordingly, multiplier 420a forms the product of A times DH ("ADH"), while multiplier 420b forms the product of C times BH ("CBH"). Controllable shifter 430 does not shift the vectors output by multiplier 420a. Compressor 440 can therefore compress (additively combine) the outputs of multipliers 420a and 420b with the same arithmetic significance. This is shown by the vertical alignment of ADH and CBH in Part 2 of FIG. 7.

The 36-bit output vectors of multiplier 200a are shifted left 18 bit positions by controllable shifter 202 (FIG. 4). Controllable shifter 450 is used to shift the 27-bit output vectors of compressor 440 9 bit positions to the left. This aligns the outputs of elements 202 and 450 as shown in Part 2 of FIG. 7, which allows compressor 210 (FIG. 4) to begin the process of additively combining them. This eventually leads to the formation of the final (approximate) product of A and BH times C and DH.

Note that the output of Part 2 in FIG. 7 requires approximately 47 or 48 bits of bus and other circuit element width (i.e., 36 bits for AC, 9 additional bits for the less significant portions of ADH and CBH, and 2 or 3 more-significant overflow bits). If the circuitry of DSP block 100 downstream from compressor 210 is basically limited to 38 bits, then some of the bits of the full (approximate) product will need to be routed out of the DSP circuitry via another adjacent DSP block. Alternatively, the width of the DSP block circuitry downstream from compressor 210 can be increased. This latter alternative will be discussed in more detail later in this specification.

Figure 8:
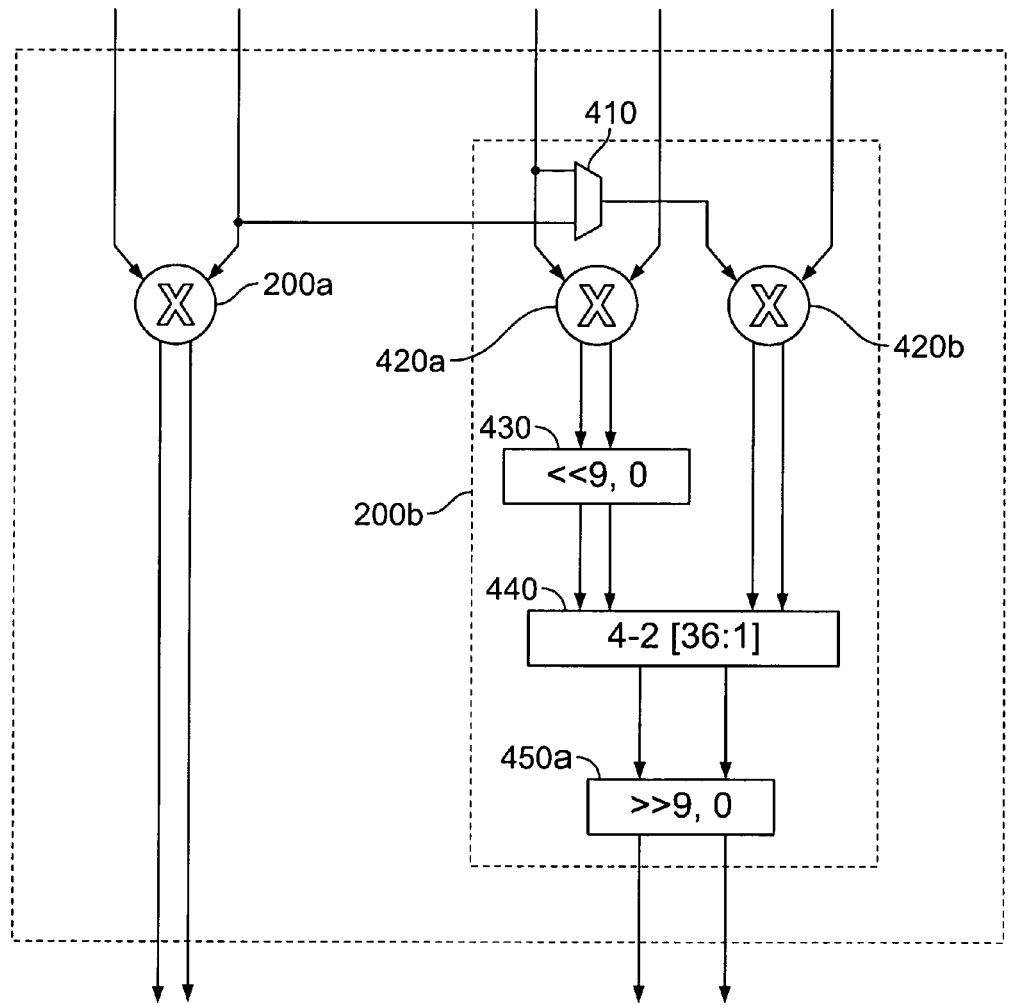
FIG. 8 is similar to FIG. 5 for another illustrative embodiment in accordance with the invention.

FIG. 8 shows an alternative embodiment of circuitry of the type shown in FIG. 5. This alternative provides another way to form an approximate 27×27 product without needing to either increase the width of the DSP block circuitry downstream from compressor 210 (FIG. 4) or route some of the product bits out via another adjacent DSP block. However, this alternative produces a final product that is somewhat more approximate than has been described above in connection with FIGS. 5 and 7.

Figure 9:
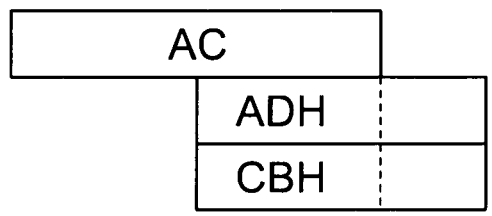
FIG. 9 is similar to FIG. 7 for another DSP operation in accordance with the invention.

FIG. 8 is basically the same as FIG. 5, except that in FIG. 8 controllable shifter 450 (now referenced 450a) has different selectable modes of operation, namely, (1) shifting the vectors applied to it 9 bit positions to the right or (2) passing the applied vectors through without any shift. To perform an approximate 27×27 multiplication, the circuitry shown in FIG. 8 can be operated in the same way as described above for 27×27 multiplication in FIG. 5 and FIG. 7. However, in this alternative, controllable shifter 450a is used to shift the outputs of compressor 440 9 bit positions to the right. This discards the 9 less-significant bits of vectors representing the sum of ADH and CBH. Only the 18 more-significant bits (plus overflow) of those sum vectors are applied to compressor 210 (FIG. 4). Also in this alternative, controllable shifter 202 (FIG. 4) passes the outputs of multiplier 200a with no shift. This allows compressor 210 to begin to form an approximate final product of A and BH times C and DH that is only 38 bits long. In other words, as shown in FIG. 9, the portions of partial products ADH and CBH to the right of the dotted line are discarded, and only the 38 more-significant bits to the left of that dotted line continue through the remaining circuitry of the DSP block.

Figure 10:
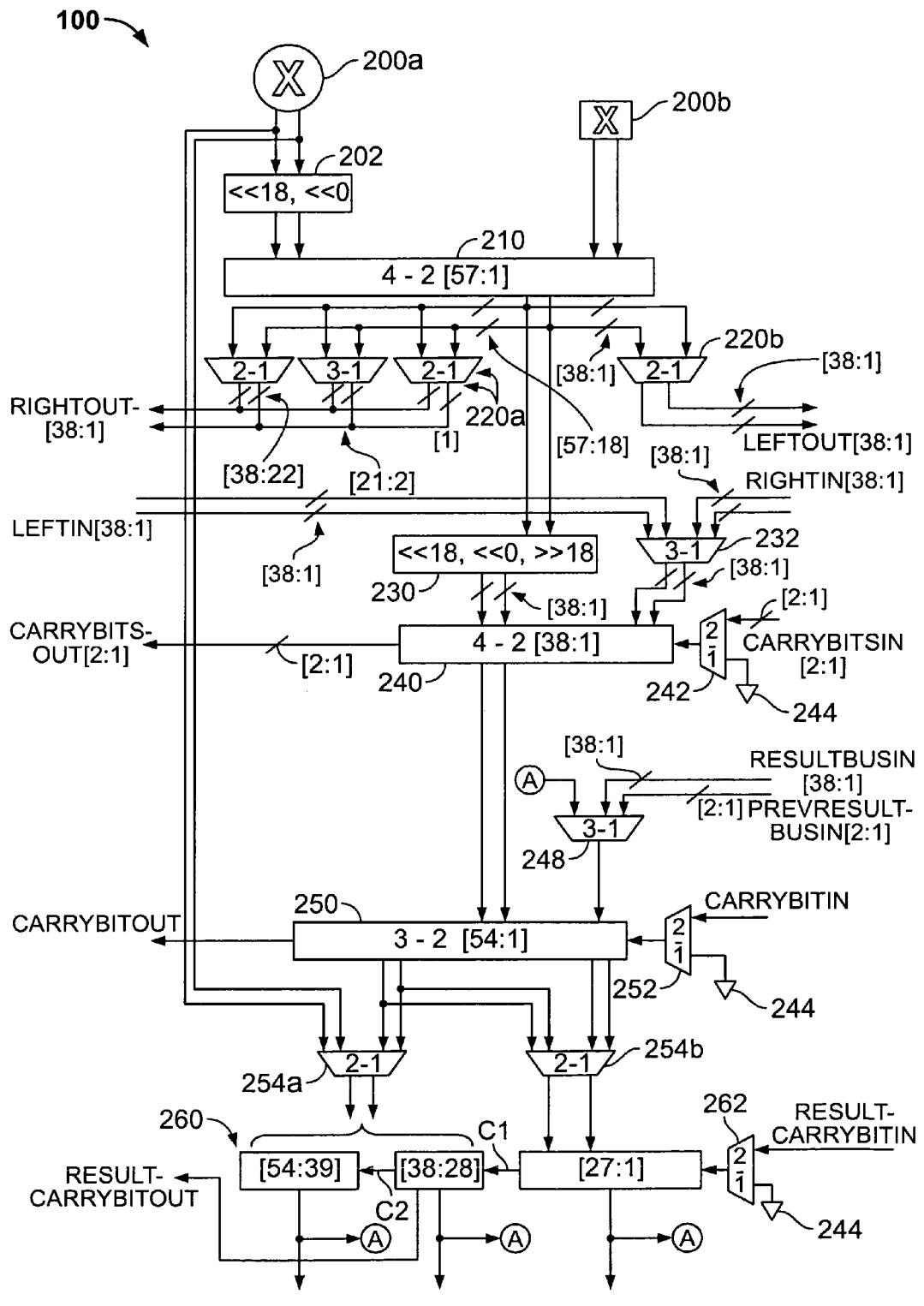
FIG. 10 is similar to FIG. 8 for another illustrative embodiment in accordance with the invention.

FIG. 10 shows an alternative embodiment of circuitry of the type shown in FIG. 4 with (1) multiplier 200b constructed as shown in FIGS. 8 and (2) other modifications suitable for providing a 54-bit output of a 27×27 multiplication. For the most part, the elements of the circuitry shown in FIG. 10 are like correspondingly numbered (and previously described) elements in FIG. 4. The following discussion can therefore be somewhat abbreviated by focusing it primarily on the differences from what has been previously shown and described. Moreover, this discussion is most efficiently handled by providing it from the standpoint of various possible modes of operating the FIG. 10 circuitry. These various operating modes are discussed under the several subheadings that follow.

A. Single 18×18 Output (or Sum of Multiple 18×18 Products)

A single 18×18 product (or the sum of two, three, or four such 18×18 products) is output from the 38 less-significant bits ("LSB") of CPA 260. For example, one such 18×18 product can come from either of multipliers 200a or 200b. Two such 18×18 products can come from multipliers 200a and 200b, with final addition taking place in the 38 LSB of CPA 260. A third such 18×18 product can come in from another similar DSP block to the left or right via the LEFTIN or RIGHTIN leads. Alternatively, vectors representing the sum of third and fourth such 18×18 products can come in via the LEFTIN or RIGHTIN leads. 4-2 compressor 240 begins the work of adding such LEFTIN or RIGHTIN inputs to the product(s) generated within the circuitry shown in FIG. 10. And, of course, CPA 260 completes the addition and final formation of the product or sum of products to be output by the FIG. 10 circuitry. Again, such an 18×18 product or sum of 18×18 products is output from the 38 LSB OF CPA 260. The [54:39] output of CPA 260 is ignored. Mux 254a selects the [38:28] segment from 3-2 compressor 250 and sends that segment to the second part [38:28] of CPA 260. The carry identified by C1 is connected from the first part [27:1] to the second part [38:28] of CPA 260.

B. Two Independent 18×18 Products (27 More-Significant Bits)

This mode allows the 27 more-significant bits ("MSBs") of each of two separate 18×18 multiplications to be output from one DSP block 100 that is constructed as shown in FIG. 10. The right multiplier 200b is routed through the block to 3-2 compressor 250. Mux circuitry 254b shifts the sum and carry vectors output by compressor 250 to the right by 9 bit positions. The resulting sum and carry vectors are added by the [27:1] part of CPA 260, which outputs the 27-bit result. The upper (more significant) 27 bits output by left multiplier 200a bypass most of the circuitry of the DSP block and are muxed (254a) into the upper two parts [54:39] and [38:28] of CPA 260. (The circuitry between elements 200a and 210 can selectively (i.e., controllably) output 0 data to element 210 so that element 210 operates only on data from element 200b.)

Figure 11:
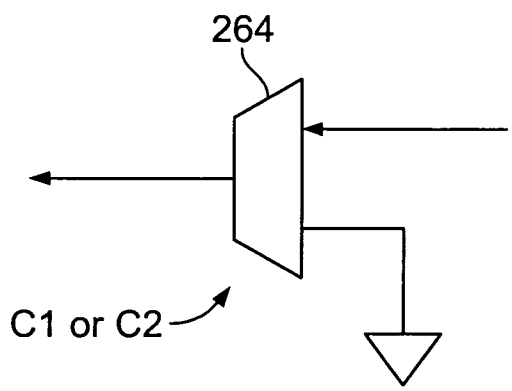
FIG. 11 shows an illustrative embodiment, in accordance with the invention, of certain components that are shown only schematically in FIG. 10.

These two parts of the CPA output the 27-bit second, independent product. Carry connection C1 in CPA 260 is open (not connected) in this mode. Carry connection C2 in CPA 260 is connected in this mode. (FIG. 11 shows an illustrative embodiment of how either of carry connections C1 or C2 can be constructed. This construction is similar to any of subnetworks 242/244, 252/244, and 262/244. In particular, mux 264 applies either (1) a carry out bit from the next lower-order portion of CPA 260 or (2) logic zero from ground source 244 to the next higher-order portion of the CPA.)

C. Pre-Existing Modes

The FIG. 10 construction of DSP block 100 also supports all pre-existing DSP block modes (e.g., those previously described). In that connection it should be noted that the carry out (RESULTCARRYBITOUT) from CPA 260 is from the 36th bit position of the CPA. The loop-back route (from CPA 260 through the circles labelled A to muxes 248) can be used to give DSP block an accumulator mode of operation. The width of this loop-back path can be 38 bits or 54 bits. PREVRESULT[2:1] is an input from an adjacent block used for constructing much larger multipliers, such as 54×54; but this is irrelevant to the present disclosure.

D. 27×27 Sub-Multiplier Mode

One 27×27 multiplication mode that is possible with the FIG. 10 circuitry is to produce a 27-bit product output from the [27:1] part of CPA 260. To support this mode, multiplier 200b can be constructed as shown in FIG. 8. Vectors indicating the sum of the data to the left of the dotted line in FIG. 9 are output by 3-2 compressor 250. Mux 254b shifts those vectors 9 bit positions to the right so that only 27-bit vectors need to be added by CPA 260.

This can be done by the [27:1] part of the CPA, which outputs the 27-bit final product.

Another 27×27 multiplication mode that is possible with the FIG. 10 circuitry (modified as described in this paragraph) is to output the full result of adding the data to the left of the dotted line in FIG. 9 from the [54:9] bit positions of CPA 260. To accomplish this, muxes 230 and compressor 240 must be made 54 bits wide.

Note that the two possible 27×27 modes described in this sub-section do not include any computation or use of the BH*DH partial product.

E. 54-Bit Output; 27×27 Full Multiplier Mode

Figure 12:
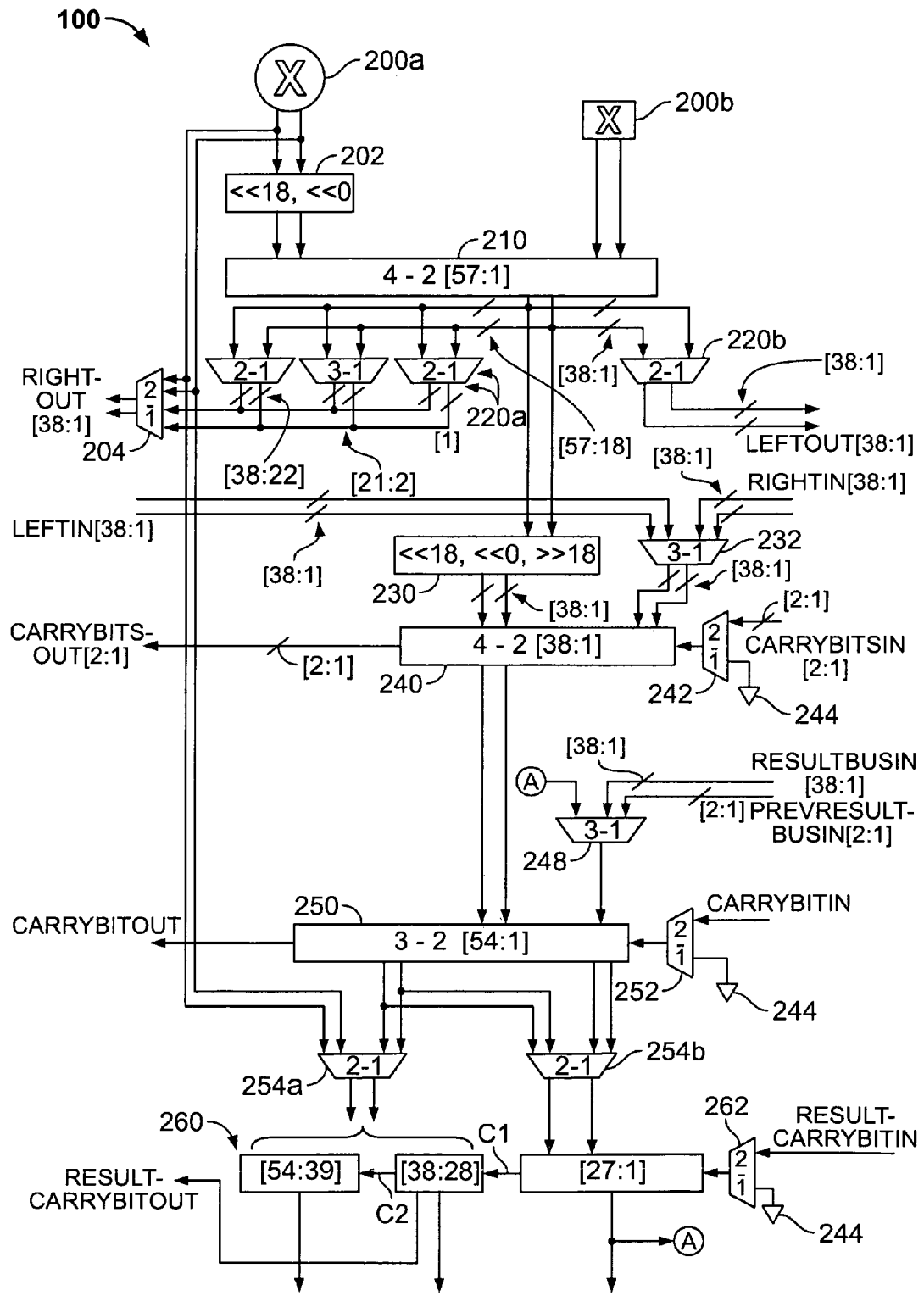
FIG. 12 is similar to FIG. 10 for yet another illustrative embodiment in accordance with the invention.
Figure 13:
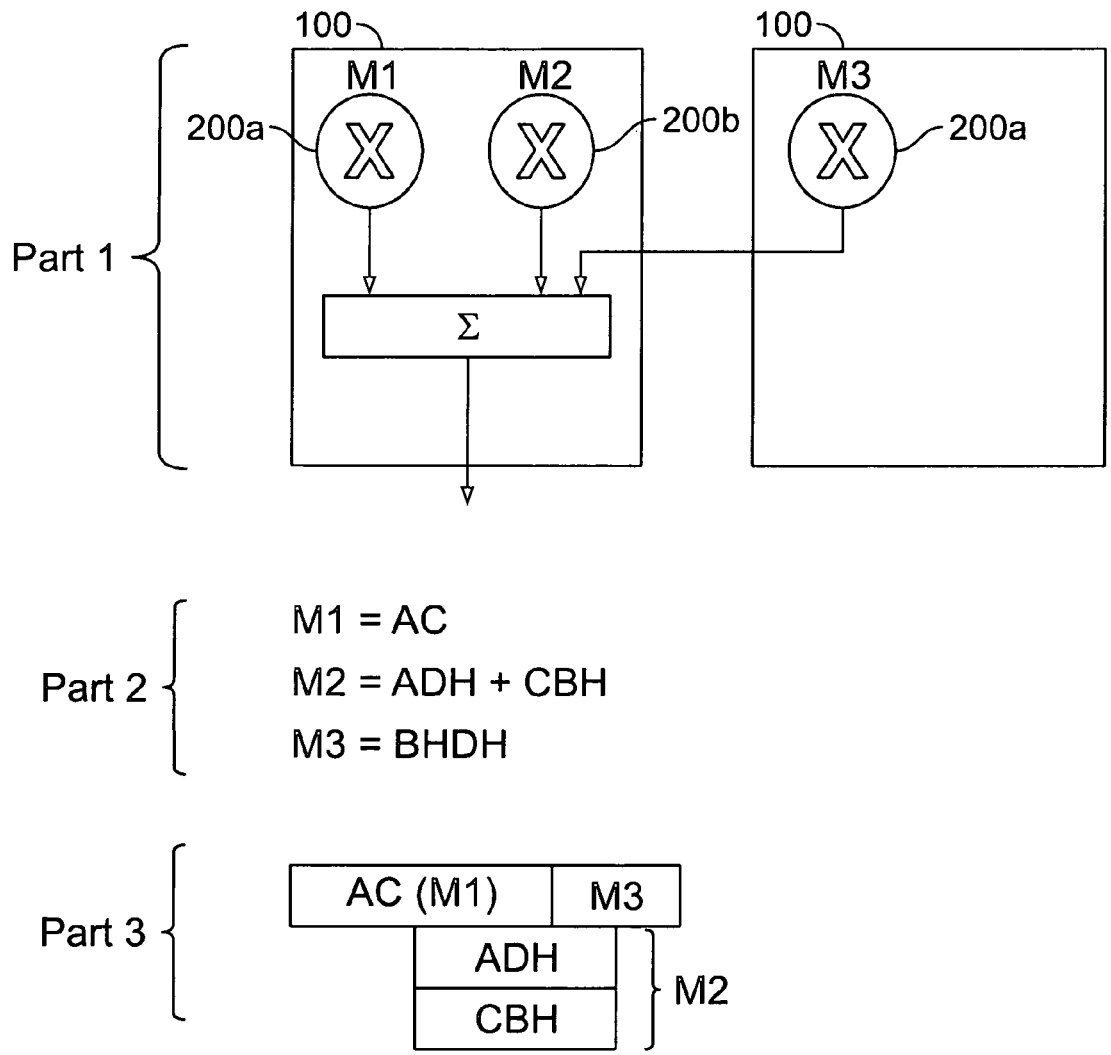
FIG. 13 is similar to certain other FIGS. for still another illustrative embodiment of the invention.

FIG. 12 shows another illustrative embodiment of a DSP block 100 constructed in accordance with the invention. The FIG. 12 circuitry is constructed to facilitate performing 27×27 multiplications with full 54-bit output product accuracy. FIG. 12 is the same as FIG. 10 with only the addition of mux circuitry 204 to allow the output vectors of multiplier 200a to be directly output for application to the RIGHTIN inputs of another similar DSP block 100 to the left of the DSP block shown in FIG. 12. FIG. 13 shows how two such DSP blocks can be used to perform full 54-bit multiplication of a 27-bit multiplicand (A and BH) by a 27-bit multiplier (C and DH). In FIG. 13 the DSP block on the left performs multiplications M1 and M2 to form partial products AC and ADH+CBH. The DSP block on the right performs multiplication M3 to form partial product BHDH. The routing 204 in the DSP block on the right is used to route the vectors indicative of BHDH to the summation (compressor and CPA) circuitry in the DSP block on the left. This summation circuitry adds all of the partial products applied to it to produce a 54-bit final product that is output by the CPA 260 of the DSP block on the left. Again, a "full" mode of this kind (i.e., 54 bit output with lower 9×9 contribution from the adjacent DSP block) requires 54 bits internally. This means that elements 230 and 240 in FIG. 12 should be modified to be 54 bits wide.

F. Two 27×27 Full Multipliers Per Three DSP Blocks

Figure 14:
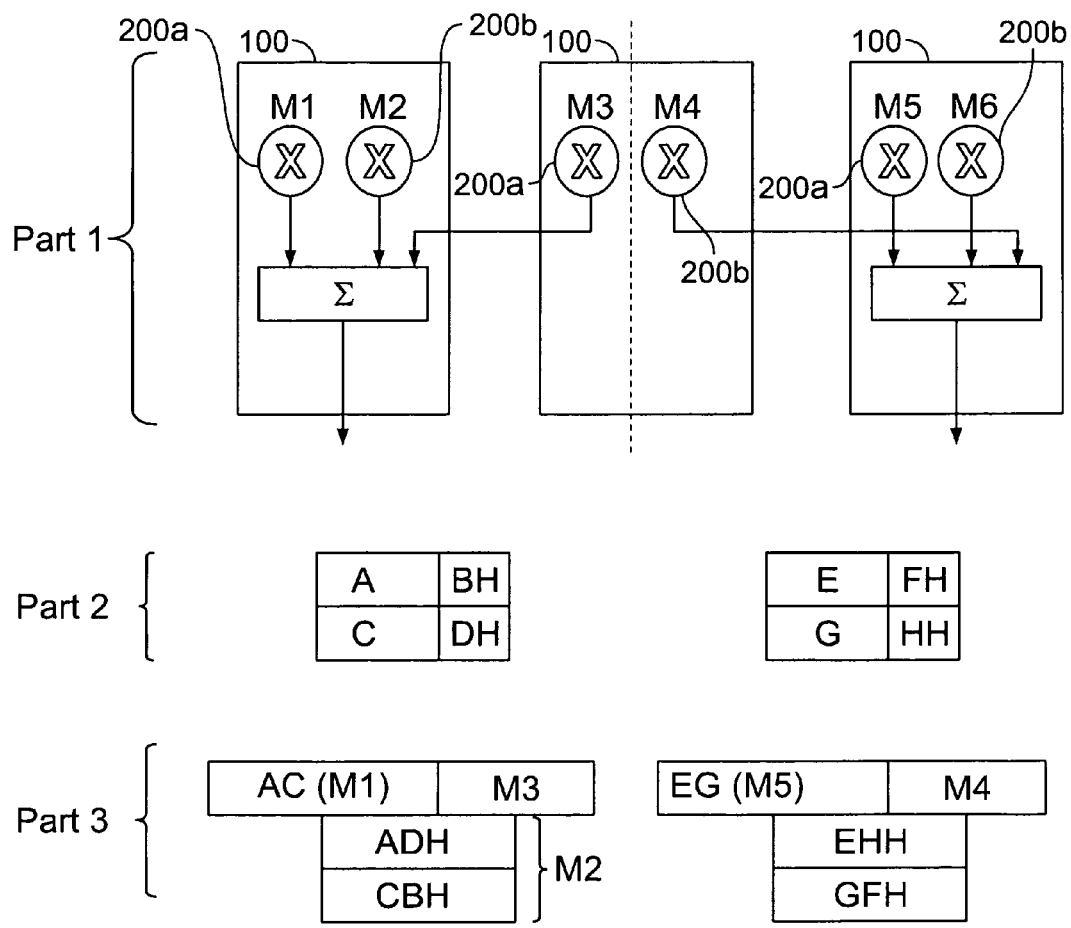
FIG. 14 is similar to FIG. 13 for yet another illustrative embodiment of the invention.

The principle illustrated by FIGS. 12 and 13 can be extended in both directions as shown in FIG. 14. The portion of FIG. 14 to the left of the vertical dotted line is the same as FIG. 12. As described above, this portion of the FIG. 14 circuitry can perform the 27×27 multiplication of A and BH times C and DH, and can output the full 54-bit product of that multiplication from the left-most DSP block 100 in FIG. 14. To do this, the FIG. 14 circuitry uses both multipliers in the left-most DSP block and the left-hand multiplier 200a in the center DSP block. This last-mentioned multiplier forms the partial product that results from multiplying BH (9 bits) by DH (9 bits).

It will be noted that the right-hand multiplier 200b in the center DSP block is not used in the above computation. It is therefore available to help the right-hand DSP block 100 perform another 27×27 multiplication with the resulting full 54-bit product output from the right-hand DSP block. In particular, this second 27×27 multiplication is shown in Part 2 of FIG. 14 as E and FH times G and HH. Multiplier 200a in the right-hand DSP block forms the 36-bit partial product of E (18 bits) times G (18 bits). Multiplier 200b (constructed as shown in FIG. 5) forms the sum of partial products E times HH (9 bits) and G times FH (9 bits). Multiplier 200b in the center DSP block forms the partial product FH times HH. Mux circuitry 220b in the center DSP block routes this last-mentioned partial product to mux circuitry 232 in the right-hand DSP block so that the right-hand DSP block can include it in its summation operations. With this assistance from part of the center DSP block, the right-hand DSP block is able to output the full 54-bit product of E and FH times G and HH.

In connection with FIG. 14 it will be noted that all three DSP blocks 100 can be identical (e.g., all can be constructed as shown in FIGS. 12). M3 and M4 both have 38-bit outputs to adjacent DSP blocks. Both M3 and M4 implement a 9×9 multiplication (e.g., BHxDH or FHxHH). M3 feeds the DSP block to the left. M4 feeds the DSP block to the right. No additional logic is required. In each such multiplication, the multiplicand (e.g., BH) and the multiplier (e.g., DH) are connected to the lower-significance 9 bits of the multiplier inputs and the upper-significance 9 bits are zeroed.

Figure 17:
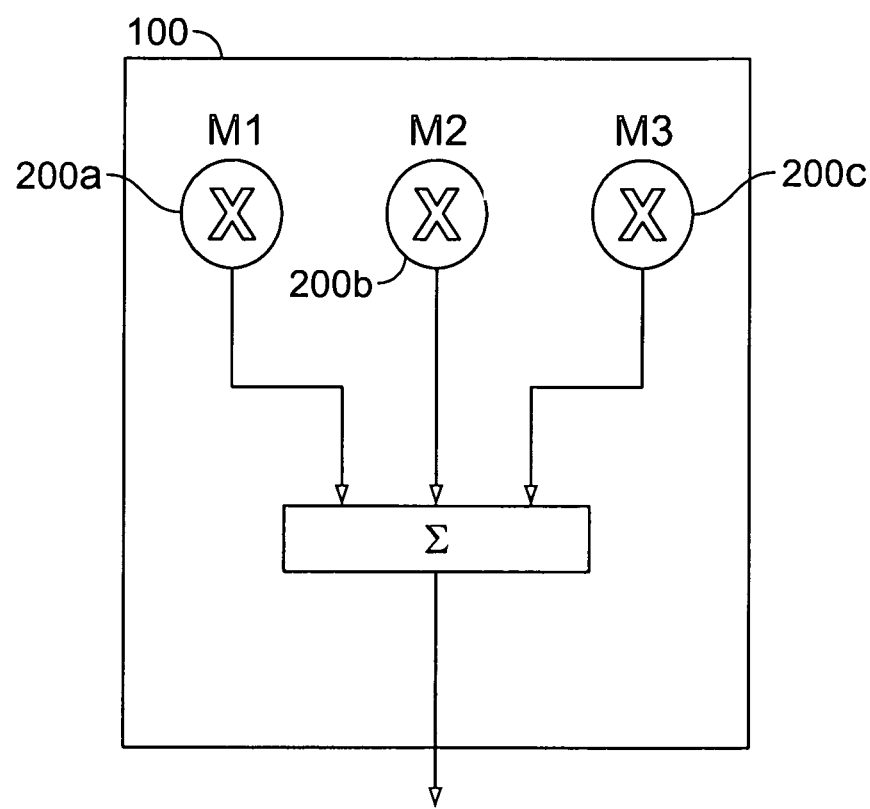
FIG. 17 is similar to a portion of FIG. 14 for still another illustrative embodiment of the invention.

Another possible construction of DSP circuit block 100 is shown in FIG. 17. This construction includes addition of a separate 9×9 multiplier circuit 200c to the DSP block to take over producing the M3 (BH*DH) partial product signals shown in FIG. 13. This allows a full 27×27 multiplication to be computed per DSP block 100 without the need to borrow any parts of another DSP block. In this embodiment, mux circuits 232 have to be expanded to mux in the 9×9 multiplier 200c output signal result, instead of from the DSP block to the right or left. The 9×9 multiplier 200c inputs can be hard-wired to the lower 9 bits of each input to multiplier 200b.

Figure 15:
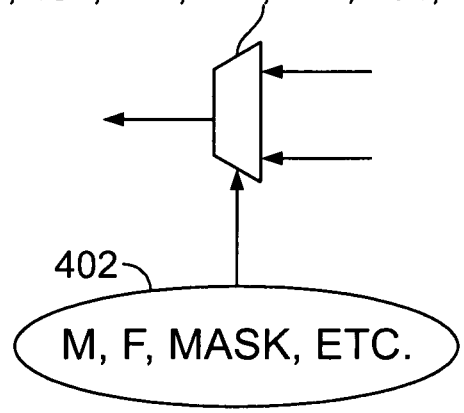
FIGS. 15 and 16 are similar to FIG. 2 for other components in accordance with the invention.
Figure 16:
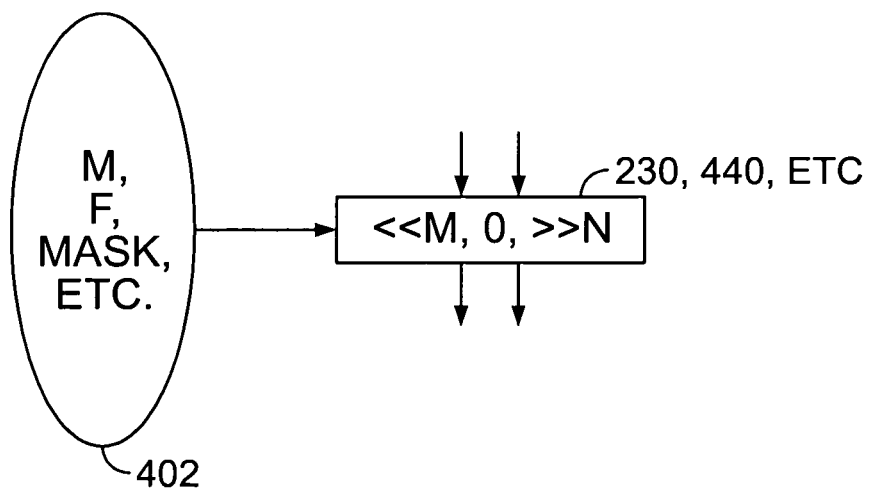

In the interest of completeness, FIG. 15 shows how the input-to-output selection made by any of the mux circuits 204, 220, 232, etc. shown herein can be controlled by a programmable memory element, fuse, mask programmable element, or the like 402 that can be part of the integrated circuit that includes the other circuitry shown herein. In particular, the logical state(s) to which element 402 is programmed determines the state(s) of the selection control signal(s) applied to mux circuitry 204, etc. Such selection control determines which of its selectable inputs (from the right in FIG. 15) the mux passes through to its output(s) (from the left in FIG. 15). FIG. 16 similarly shows how the left or right shifting operations performed by any of the controllable shifters 230, 440, etc. shown herein can be controlled by programmable memory, fuse, etc. 402 if desired.

Again, the logical state(s) to which element 402 is programmed controls whether shifter 230, etc. shifts the data it receives (1) to the left by M bit positions, (2) to the right by N bit positions, or (3) not at all (zero bit-position shift).

Any of the multiplexers employed in the DSP circuitry of this invention can be of the type that can selectively (i.e., controllably) output zero (0) data. This also includes any of the controllable shifters employed herein.

It will be understood that the foregoing is only illustrative of the principles of the invention, and that various modifications can be made by those skilled in the art without departing from the scope and spirit of the invention. For example, while 18-bit basic word size is preferred, some modification (e.g., to 16 bits or 20 bits) of the basic word size may be appropriate for some situations. It will then be apparent to those skilled in the art how the sizes of various circuit components can be scaled up or down to support such a different basic word size. It will also be understood that the FIGS. herein like FIGS. 1-5, 8, 10-12, parts of 13 and 14, and 15-17 show electronic circuitry in which most or all of the circuit elements (like 200, 202, 210, 220, 260, etc.) are separate elements (typically integrated together on an integrated circuit), each of which elements is dedicated (e.g., hard-wired to at least a significant extent) to performing the function(s) described for that element herein by operating on electrical input signals to produce other electrical output signals.

These electrical signals may sometimes be referred to as data, bits, vectors, "1", "0", values, multiplicand, multiplier, product, partial product, sum, or the like; but in all cases they are in fact actual electrical signals representing the specified information.

Similarly, certain of the electrical circuit elements shown herein may sometimes be referred to by the operations they perform (e.g., "multiplier 200a"), but in all cases these elements are actual electrical circuitry (e.g., multiplier circuitry) performing those operations. The same is true for references to DSP circuitry, DSP operations, or the like. All such operations are performed by electrical circuitry operating on electrical signals as mentioned above.

The invention claimed is:

1. Digital signal processing ("DSP") block circuitry comprising:
    first and second multiplier circuits;
    first circuitry for selectively shifting bit positions of output signals of the first multiplier circuit relative to bit positions of output signals of the second multiplier circuit; and
    first circuitry for selectively additively combining output signals of the first circuitry for selectively shifting and the second multiplier circuit, wherein the second multiplier circuit comprises:
    first and second sub-multiplier circuits;
    second circuitry for selectively shifting bit positions of output signals of the first sub-multiplier circuit relative to bit positions of output signals of the second sub-multiplier circuit; and
    second circuitry for additively combining output signals of the second circuitry for selectively shifting and the second sub-multiplier circuit; and wherein:
    said DSP block circuitry is part of a programmable integrated circuit device having general-purpose interconnect circuitry; said DSP clock circuitry further comprising:
    redundancy circuitry for selectably allowing outputs of each one of said first and second multiplier circuits to be routed to (1) another instance of said DSP block circuitry that is immediately adjacent to that DSP block circuitry, and (2) yet another instance of said DSP block circuitry that is not immediately adjacent to that DSP block circuitry, without using said general-purpose interconnect circuitry for said routing.

2. The DSP block circuitry defined in claim 1 further comprising:
    routing circuitry for deriving one set of input signals to the second sub-multiplier circuit from a selectable one of (1) one set of input signals to the first sub-multiplier circuit and (2) one set of input signals to the first multiplier circuit.

3. The DSP block circuitry defined in claim 1 further comprising:
    third circuitry for selectively shifting bit positions of output signals of the second circuitry for additively combining relative to bit positions of output signals of the first multiplier circuit.

4. The DSP block circuitry defined in claim 1 further comprising:
    first routing circuitry for selectively routing output signals of the first multiplier circuit to a first other instance of the DSP block circuitry; and
    second routing circuitry for selectively routing signals received from the first routing circuitry of a second other instance of the DSP block circuitry to the first circuitry for selectively additively combining.

5. The DSP block circuitry defined in claim 4 further comprising:
    third routing circuitry for selectively routing output signals of the second multiplier circuit to the second other instance of the DSP block circuitry, and wherein the second routing circuitry can alternatively selectively route signals received from the third routing circuitry of the first other instance of the DSP block circuitry to the first circuitry for selectively additively combining.

6. The DSP block circuitry defined in claim 4 wherein the first circuitry for selectively additively combining includes fourth circuitry for selectively shifting bit positions of signals representing an additive combination of output signals of the first circuitry for selectively shifting and the second multiplier circuit relative to output signals of the second routing circuitry.

7. The DSP block circuitry defined in claim 1 wherein the first circuitry for selectively additively combining includes fifth circuitry for selectively shifting bit positions of signals to eliminate data in bit positions below a predetermined threshold of arithmetic significance.

8. The DSP block circuitry defined in claim 1 wherein the first multiplier circuit is an 18×18 multiplier circuit, and wherein each of the first and second sub-multiplier circuits is a 9×18 multiplier circuit.

9. The DSP block circuitry defined in claim 8 wherein the second circuitry for selectively shifting and the second circuitry for additively combining are configurable to cooperate to cause the second multiplier circuit to operate as an 18×18 multiplier circuit.

10. The DSP block circuitry defined in claim 9 wherein the second circuitry for selectively shifting and the second circuitry for additively combining are alternatively configurable to cooperate to cause the second multiplier circuit to produce a sum of two 9×18 multiplications.

11. The DSP block circuitry defined in claim 10 wherein the first and second multiplier circuitry and the first circuitry for selectively additively combining are configurable to cooperate to produce a product of a 27-bit multiplicand times a 27-bit multiplier, except for a partial product of 9 less-significant bits of the multiplicand and 9 less-significant bits of the multiplier.

12. The DSP block circuitry defined in claim 11 wherein the first circuitry for selectively additively combining includes circuitry for selectively truncating the product to its 27 more-significant bits.

13. The DSP block circuitry defined in claim 11 wherein the first circuitry for selectively additively combining includes circuitry for selectively receiving the partial product from another instance of the DSP block circuitry, whereby the DSP block circuitry is configurable so that the product includes the partial product.

14. The DSP block circuitry defined in claim 11 further comprising:
a third multiplier circuit for producing the partial product of 9 less-significant bits of the multiplicand and 9 less-significant bits of the multiplier, and for applying that partial product to the first circuitry for selectively additively combining, whereby the DSP block circuitry is configurable so that the product includes that partial product.

15. The DSP block circuitry defined in claim 1 further comprising:
circuitry for selectively keeping output signals of the first multiplier circuit separate from other signals in the first circuitry for selectively additively combining so that the first circuitry for selectively additively combining does not additively combine the output signals of the first and second multiplier circuits if desired.

16. A plurality of digital signal processing ("DSP") block circuits, each of the DSP block circuits comprising:
first and second multiplier circuits;
first routing circuitry for outputting signals from a selectable one of (1) the first multiplier circuit in a first other one of the DSP block circuits and (2) the second multiplier circuit in a second other one of the DSP block circuits; and
first circuitry to which is input (a) output signals of the first and second multiplier circuits and (b) output signals of the first routing circuitry, for additively combining the output signals of the first and second multiplier circuits and the output signals of the first routing circuitry with relative arithmetic significance selectable from among three levels of relative arithmetic significance; wherein:
said plurality of DSP block circuits are part of a programmable integrated circuit device having general-purpose interconnect circuitry; each of said DSP block circuits further comprising:
redundancy circuitry for selectably allowing outputs of each one of said first and second multiplier circuits to be routed to (1) another one of said DSP block circuits that is immediately adjacent to that DSP block circuit, and (2) yet another one of said DSP block circuits that is not immediately adjacent to that DSP block circuit, without using said general-purpose interconnect circuitry for said routing.

17. The plurality of DSP block circuits defined in claim 16 wherein the first routing circuitry obtains output signals from the first multiplier circuitry in the first other one of the DSP block circuits prior to any operation on those output signals by the first circuitry for additively combining in the first other one of the DSP block circuits.

18. Digital signal processing ("DSP") block circuitry comprising:
first and second multiplier circuits; and
first circuitry for selectively additively combining output signals of the first and second multiplier circuits with selectable relative arithmetic significance, wherein the second multiplier circuit comprises:
first and second sub-multiplier circuits, and
second circuitry for additively combining output signals of the first and second sub-multiplier circuits with selectable relative arithmetic significance; and wherein:
said DSP block circuitry is part of a programmable integrated circuit device having general-purpose interconnect circuitry; said DSP block circuitry further comprising:
redundancy circuitry for selectably allowing outputs of each one of said first and second multiplier circuits to be routed to (1) another instance of said DSP block circuitry that is immediately adjacent to that DSP block circuitry, and (2) yet another instance of said DSP block circuitry that is not immediately adjacent to that DSP block circuitry, without using said general-purpose interconnect circuitry for said routing.

19. The DSP block circuitry defined in claim 18 further comprising:
routing circuitry for deriving one set of input signals to the second sub-multiplier circuit from a selectable one of (1) one set of input signals to the first sub-multiplier circuit and (2) one set of input signals to the first multiplier circuit.

20. The DSP block circuitry defined in claim 18 wherein the first circuitry for selectively combining is alternatively able to output separate first and second product signals for the first and second multiplier circuits, respectively.

21. The DSP block circuitry defined in claim 18 wherein the first circuitry for selectively combining is able to selectively truncate signals having arithmetic significance below a predetermined threshold level.

\* \* \* \* \*